(12) United States Patent
Vellianitis et al.

(10) Patent No.: US 12,513,908 B2
(45) Date of Patent: Dec. 30, 2025

(54) VERTICALLY STACKED FeFETs WITH COMMON CHANNEL

(71) Applicant: Taiwan Semiconductor Manufacturing Company, Ltd., Hsinchu (TW)

(72) Inventors: Georgios Vellianitis, Heverlee (BE); Gerben Doornbos, Kessel-Lo (BE)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 375 days.

(21) Appl. No.: 18/149,734

(22) Filed: Jan. 4, 2023

(65) Prior Publication Data

US 2024/0121965 A1   Apr. 11, 2024

Related U.S. Application Data

(60) Provisional application No. 63/413,315, filed on Oct. 5, 2022.

(51) Int. Cl.
| | |
|---|---|
| *H10D 64/00* | (2025.01) |
| *H01L 23/522* | (2006.01) |
| *H10B 51/10* | (2023.01) |
| *H10B 51/20* | (2023.01) |
| *H10D 30/01* | (2025.01) |
| *H10D 30/69* | (2025.01) |
| *H10D 64/01* | (2025.01) |
| *H10D 64/23* | (2025.01) |

(52) U.S. Cl.
CPC ......... *H10B 51/20* (2023.02); *H01L 23/5226* (2013.01); *H10B 51/10* (2023.02); *H10D 30/0415* (2025.01); *H10D 30/701* (2025.01); *H10D 64/033* (2025.01); *H10D 64/251* (2025.01)

(58) Field of Classification Search
CPC ........ H10B 51/20; H10B 51/10; H10B 51/30; H01L 23/5226; H10D 30/0415; H10D 30/701; H10D 64/033; H10D 64/251
USPC ......................................................... 257/295
See application file for complete search history.

(56) References Cited

U.S. PATENT DOCUMENTS

2017/0034646 A1* 2/2017 Song ..................... H04W 8/005
2017/0034647 A1* 2/2017 Takeuchi .............. H04W 76/15
(Continued)

*Primary Examiner* — Sheikh Maruf
(74) *Attorney, Agent, or Firm* — Eschweiler & Potashnik, LLC

(57) ABSTRACT

Ferroelectric field effect transistors are in a three-dimensional structure that includes vertical columns. Source/drain electrodes are provided by horizontal conductive layers that are interleaved with dielectric layers. Channels for the FeFETs in each vertical column are provided by a continuous semiconductor layer, e.g., a vertical strip of semiconductor. Another vertical strip may provide the ferroelectric layers for the FeFETs in the vertical column. The gate electrodes are provided by a control gate structure that connects the gate electrodes in parallel. The source/drain electrodes of multiple vertical columns may be connected in parallel. The source/drain electrodes of multiple tiers may also be connected in parallel. This structure provides high area density, adds an extra degree of freedom in circuit design, and lends itself to the use of oxide semiconductor channels.

20 Claims, 27 Drawing Sheets

(56) References Cited

U.S. PATENT DOCUMENTS

| | | | |
|---|---|---|---|
| 2017/0236896 A1* | 8/2017 | Lu | H10B 43/50 |
| | | | 257/314 |
| 2017/0278571 A1* | 9/2017 | Chowdhury | G11C 16/0483 |
| 2018/0138189 A1* | 5/2018 | Kai | H01L 21/76805 |
| 2018/0342531 A1* | 11/2018 | Susuki | H10B 43/35 |
| 2019/0363132 A1* | 11/2019 | Zhang | H10B 61/10 |
| 2019/0393266 A1* | 12/2019 | Ando | H10N 70/021 |
| 2020/0075631 A1* | 3/2020 | Dong | H10D 30/701 |
| 2020/0242534 A1* | 7/2020 | Klink | G06Q 10/06395 |
| 2020/0373355 A1* | 11/2020 | Lien | G11C 13/004 |
| 2021/0082955 A1* | 3/2021 | Rajashekhar | H10D 64/033 |
| 2021/0335999 A1* | 10/2021 | Kai | H10B 41/27 |
| 2021/0351191 A1 | 11/2021 | Lai et al. | |
| 2021/0399014 A1 | 12/2021 | Wu et al. | |

\* cited by examiner

VERTICALLY STACKED FeFETs WITH COMMON CHANNEL

REFERENCE TO RELATED APPLICATION

This application claims the benefit of U.S. Provisional Application No. 63/413,315, filed on Oct. 5, 2022, the contents of which are herby incorporated by reference in their entirety.

BACKGROUND

Many modern-day electronic devices contain electronic memory. Electronic memory may be volatile memory or non-volatile memory. Non-volatile memory is able to retain its stored data in the absence of power, whereas volatile memory loses its stored data when power is lost. Dynamic random-access memory (DRAM) that requires frequent refresh is volatile memory. Non-volatile memory includes, for example, resistive random-access memory (RRAM), magnetoresistive random-access memory (MRAM), ferroelectric random-access memory (FeRAM), phase-change memory (PCM), and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
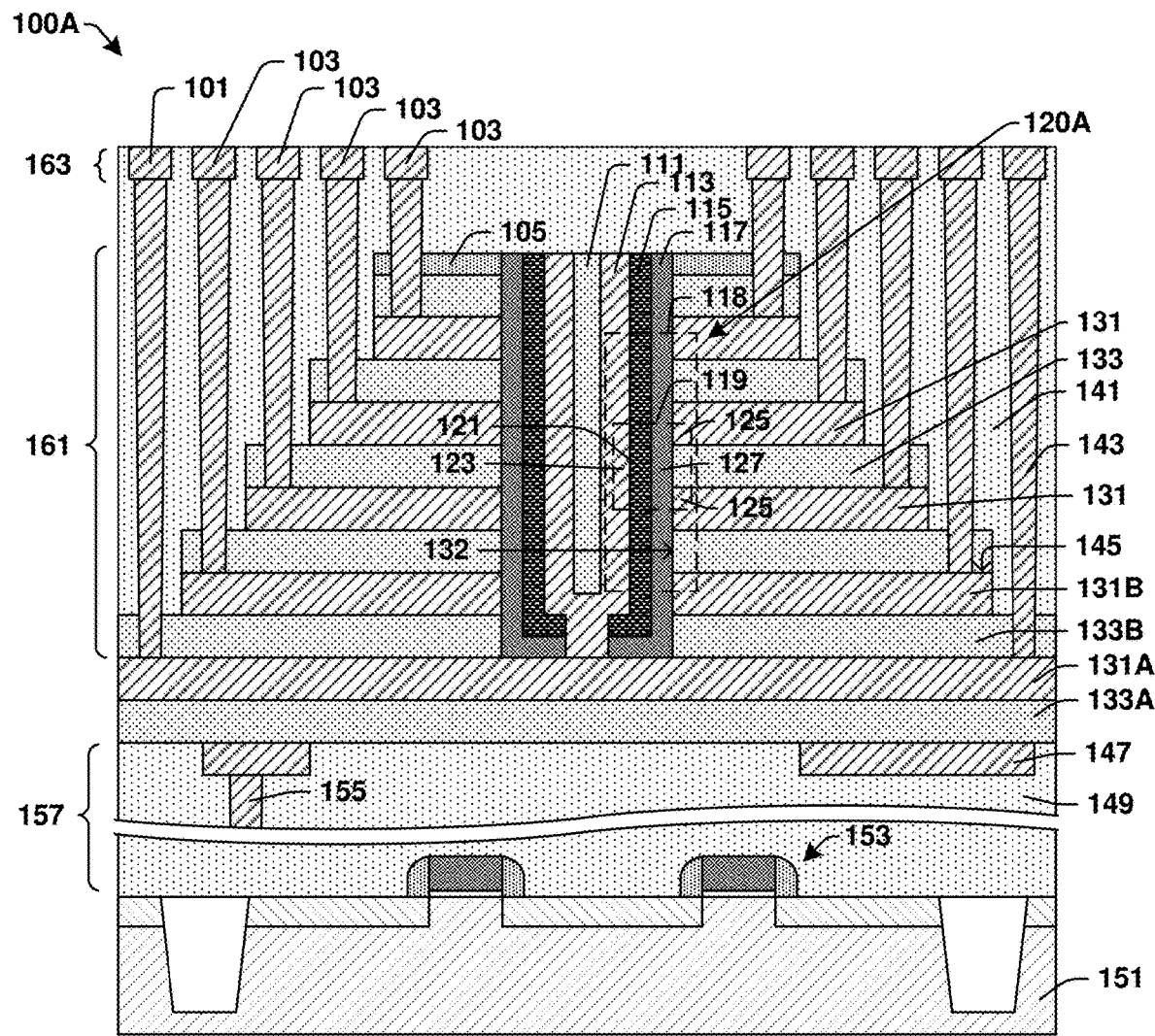
FIGS. 1-5 illustrate cross-sectional views of integrated chips with memory devices according to various embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric memory is non-volatile, may be written and read with very low power, and is cost effective. Ferroelectric memory may be implemented in a capacitor structure which provides ferroelectric random access memory (FeRAM) or in a transistor structure which provides ferroelectric field effect transistors (FeFETs). FeFETs with oxide semiconductor channels have additional benefits compared to FeFETs with silicon channels. Those additional benefits include low off/standby current, superior short channel effect control, and a low thermal budget that lends itself to back-end-of-line (BEOL) processing.

The present disclosure provides FeFETs with a three-dimensional structure that provides high area density, provides an additional degree of freedom in circuit design, and lends itself to the use of oxide semiconductor channels. The FeFETs are in vertical columns that may be disposed within a metal interconnect structure above a semiconductor substrate. Source/drain electrodes are provided by horizontal conductive layers that are interleaved with dielectric layers. Channels for the FeFETs in the vertical column are provided by a continuous semiconductor layer, e.g., a vertical strip or slab of semiconductor. Another vertical strip or slab may provide the ferroelectric layers for the FeFETs in the vertical column. The gate electrodes for the FeFETs in the vertical column may be provided by a control gate structure that connects the gate electrodes in parallel. In some embodiments the control gate structure is wishbone-shaped with each branch providing the gate electrodes for the FeFETs in one of two vertical columns that face one another.

Another vertical column of FeFETs may be adjacent to and side-by-side with the first vertical column. The FeFETs in the adjacent vertical column may share the horizontal conductive layers with the FeFETs in the first vertical column so that the sources/drain electrodes of the FeFETs in the first vertical column are connected in parallel with the sources/drain electrodes of corresponding FeFETs in the adjacent vertical column. In some embodiments, the gate electrodes of the FeFETs in the adjacent vertical column are connected in parallel with the gate electrodes of the FeFETs in the first vertical column. In this configuration the FeFETs of corresponding tiers in the first vertical column and the adjacent column operate in parallel. FeFETs that are connected in parallel can provide the current of a single larger FeFET while having the switching speeds of the smaller FeFETs. In some embodiments, the gate electrodes of the FeFETs in the adjacent vertical column are configured for control independent of the gate electrodes for the FeFETs in the first vertical column. This configuration provides higher density data storage. In some embodiments, the gate electrodes of the FeFETs in the adjacent vertical column are provided by a second wishbone-shaped control gate structure that is side-by-side with and adjacent to the first wishbone-shaped control gate structure.

In some embodiments, every other horizontal conductive layer is connected to a single source line. In some embodiments, the source line is coupled to ground. The horizontal conductive layers between the ones connected to source lines may be connected to bit lines. In some embodiments, each of the bit lines is distinct whereby pairs of FeFETs in the vertical column may be operated independently from the others. In some embodiments, two or more of the horizontal conductive layers are connected to the same bit line, whereby four or more of the FeFETs in the vertical column operate in parallel. In some embodiments, one bit line serves all the FeFETs in the column, whereby all of the FeFETs in the vertical column operate in parallel. In some embodiments, voltages for each of the horizontal conductive layers are independently controlled, whereby the horizontal conductive layers may be selectively operated as either source electrodes or drain electrodes and each of the FeFETs in the vertical column may be programmed and read independently from the others. These options allow for a design to trade-off between current capacity and memory density.

In some embodiments, top vias connect to each of the horizontal conductive layers. In some embodiments, the conductive layers that are lower jut out from underneath the conductive layers that are higher in order to provide ledges on which the top vias land. In some embodiments, the ledges form a staircase pattern. In some embodiments, a row of the top vias land on each ledge. A larger number of vias allows for improved performance. Vias landing on each of the horizontal conductive layers allows for variety of control options.

In some embodiments, an additional horizontal conductive layer underneath the others is coupled to the control gate structure. In some embodiments, the joint of a wishbone-shaped control gate structure lands on the additional horizontal conductive layer. Vias may connect to that additional horizontal conductive layer to provide a word line connection for the gate electrodes. Making the connection through the additional horizontal conductive layer allows the connection to have very low resistance. In some alternate embodiments, the control gate structure is coupled to the word line through a top via that is above the control gate structure. In some alternate embodiments, the control gate structure is coupled to the word line through a bottom via that is below the control gate structure. Making the word line connection through the top via or the bottom via is conducive to making a greater number of control gate structures operable independently from one another.

Some aspects of the present disclosure relate to a method of forming an integrated chip with ferroelectric memory. The method includes forming a superlattice of alternating conductive and dielectric layers and etching a trench in the superlattice. In some embodiments, the conductive layers extend around an end of the trench, whereby conductive layers on opposite sides of the trench remain coupled. In some embodiments, the trench divides the stack in two. In either case, a semiconductor layer is deposited in the trench so that vertical slabs of the semiconductor are on the sides of the trench. In some embodiments, the semiconductor is an oxide semiconductor. A ferroelectric layer is deposited in the trench after the ferroelectric layer so that vertical slabs of the ferroelectric material cover the semiconductor. A conductor is deposited in the trench after the ferroelectric layer. In some embodiments, an etch is carried out to form an opening through the ferroelectric layer and the semiconductor layer at the bottom of the trench followed by deposition of additional conductor. In some embodiments, the conductor on the sides of the trench joins with the conductor that deposits within the opening at the bottom of the trench to form a control gate structure with a wishbone-shaped profile. In some embodiments, the conductor fills the trench.

The ferroelectric memory produced by the foregoing method has FeFETs with gate electrodes provided by the control gate structure and source/drain electrodes provided by the horizontal conductive layers. The ferroelectric layer and the semiconductor layer provide the data storage layers and the channels. Connections are formed to operate the electrodes. In some embodiments, forming those connections includes etching the superlattice so that the horizontal conductive layers that are lower in the stack jut out from underneath horizontal conductive layers that are higher in the stack to form ledges. The source/drain connections include vias that land on these ledges. In some embodiments, a horizontal conductive layer directly beneath the superlattice receives vias and is itself in contact with the control gate structure.

In some embodiments, the method further includes an etch that divides the vertical slabs of the ferroelectric layer and the semiconductor layer into a plurality of side-by-side strips. In some embodiments, the etch likewise divides the control gate structure into a plurality of side-by-side control gate structures. These embodiments, increase the number of FeFETs that are formed and provide FeFETs that have narrower channels and operate faster.

FIG. 1 illustrates a cross-sectional view of an integrated chip 100A comprising a memory device 120A having an FeFET 119. The FeFET 119 is one in a vertical column 118. The FeFET 119 has source/drain electrodes 125, a channel 127, a data storage layer 121, and a gate electrode 123. The data storage layer 121 is between the channel 127 and the gate electrode 123. The source/drain electrodes 125 may function as either sources or drains and are provided by horizontal conductive layers 131. The horizontal conductive layers 131 are interleaved with dielectric layers 133 in a stack 161. A top of the stack 161 may be a hard mask 105. An interlevel dielectric 141 may be disposed over and on the sides of the stack 161.

The channels 127 of the FeFETs 119 in the vertical column 118 are provided by a continuous semiconductor layer 117 that may be in the form of a vertical slab or a vertical strip along an internal sidewall 132 of the stack 161. The data storage layers 121 of the FeFETs 119 in the vertical column 118 are provided by a continuous ferroelectric layer 115 that may also be in the form of a vertical slab or a vertical strip. The gate electrodes 123 of the FeFETs 119 in the vertical column 118 are provided by a control gate structure 113 that extends vertically beside the continuous ferroelectric layer 115. The control gate structure 113 has a wishbone-shaped profile. The gate electrodes 123 in the vertical column 118 are provided by one branch of the wishbone. The gate electrodes 123 of another vertical column of FeFETs 119 are provided by the other branch of the wishbone. A space between the two branches is filled by a dielectric 111.

The control gate structure 113 is coupled to a horizontal conductive layer 131A that is beneath the stack 161. A dielectric layer 133B that is between the horizontal conductive layer 131A and the lowest horizontal conductive layer 131B in the stack 161 may be thicker than the other dielectric layers 133 in the stack 161. The greater thickness may prevent leakage between the horizontal conductive layer 131B and horizontal conductive layer 131A via a parasitic transistor. A dielectric layer 133A beneath the stack 161 may be thicker than and/or of a different composition from the dielectric layers 133 in the stack 161 so to reduce parasitic capacitance between the horizontal conductive layer 131B and underlying wires 147 in a metal interconnect 157.

The metal interconnect 157 is disposed over a substrate 151. Devices such as transistors 153 may be formed on the substrate 151 beneath the memory device 120A. The memory device 120A may be disposed anywhere in the metal interconnect 157. In some embodiments, the memory device 120A is disposed between two adjacent metallization layers of the metal interconnect 157. In some embodiments, the memory device 120A spans two or more metallization layers of the metal interconnect 157. In some embodiments, the memory device 120A is disposed at the base of the metal interconnect 157. In some embodiments, the memory device 120A is formed directly on the substrate 151. In the latter case, a doped region of the substrate 151 may replace the horizontal conductive layer 131A.

Each of the horizontal conductive layers 131 forms a ledge 145 that juts out from beneath the overlying horizontal conductive layers 131. Vias 143 land on the ledges 145 to form connections with wires 101 and 103 in an overlying metallization layer 163. The ledges 145 may extend into the depth of the page and there may be a row of the vias 143 on each ledge 145. The wires 103 provide source/drain connections such as bit lines and source lines. The wire 101 provides a word line for operating the gate electrodes 123.

Figure 2:
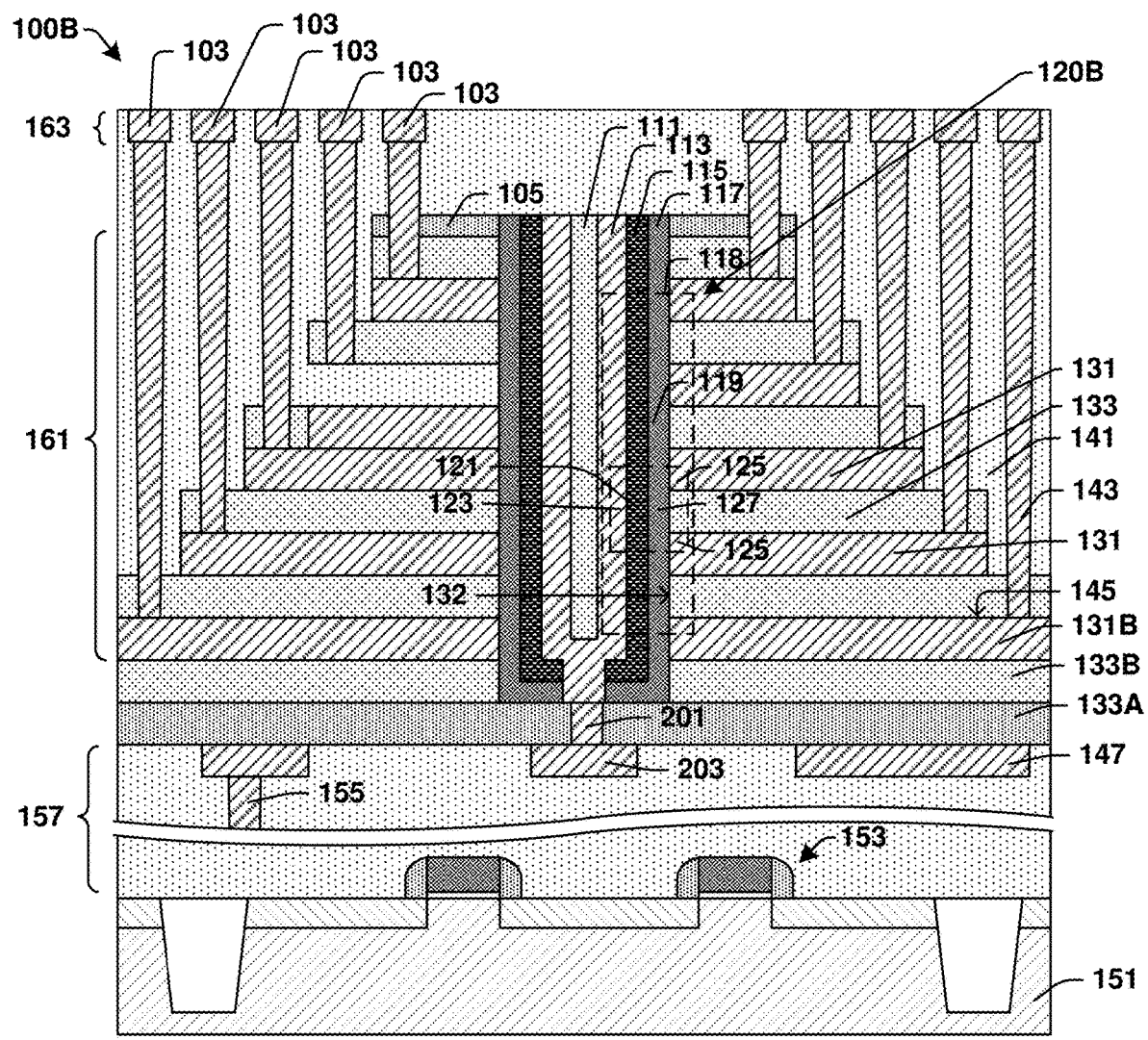

FIG. 2 illustrates a cross-sectional view of an integrated chip 100B comprising another memory device 120B that includes FeFETs 119. The memory device 120B differs from the memory device 120A of FIG. 1 in that the control gate structure 113 that provides the gate electrodes 123 is coupled to a word line 203 through a bottom via 201 rather than through a horizontal conductive layer 131A (see FIG. 1). The bottom via 201 may be formed in the bottom dielectric layer 133A which may have a different thickness and/or composition from the dielectric layers 133.

Figure 3:
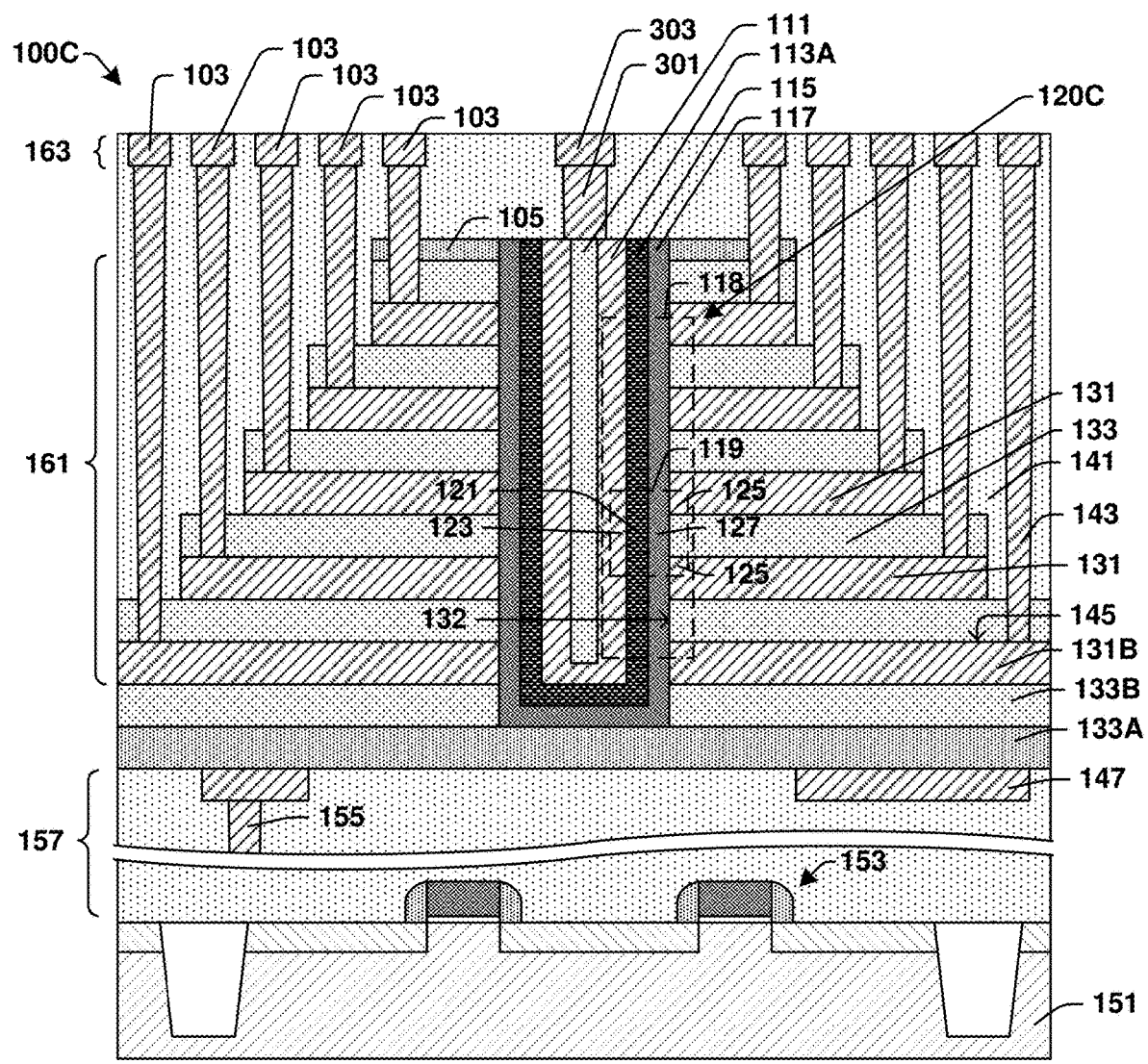

FIG. 3 illustrates a cross-sectional view of an integrated chip 100C comprising a memory device 120C that also includes FeFETs 119. In the memory device 120C, the gate electrodes 123 are provided by a control gate structure 113A that is coupled through a top via 301 to a word line 303 that is above the stack 161. The control gate structure 113A has a U-shaped profile.

Figure 4:
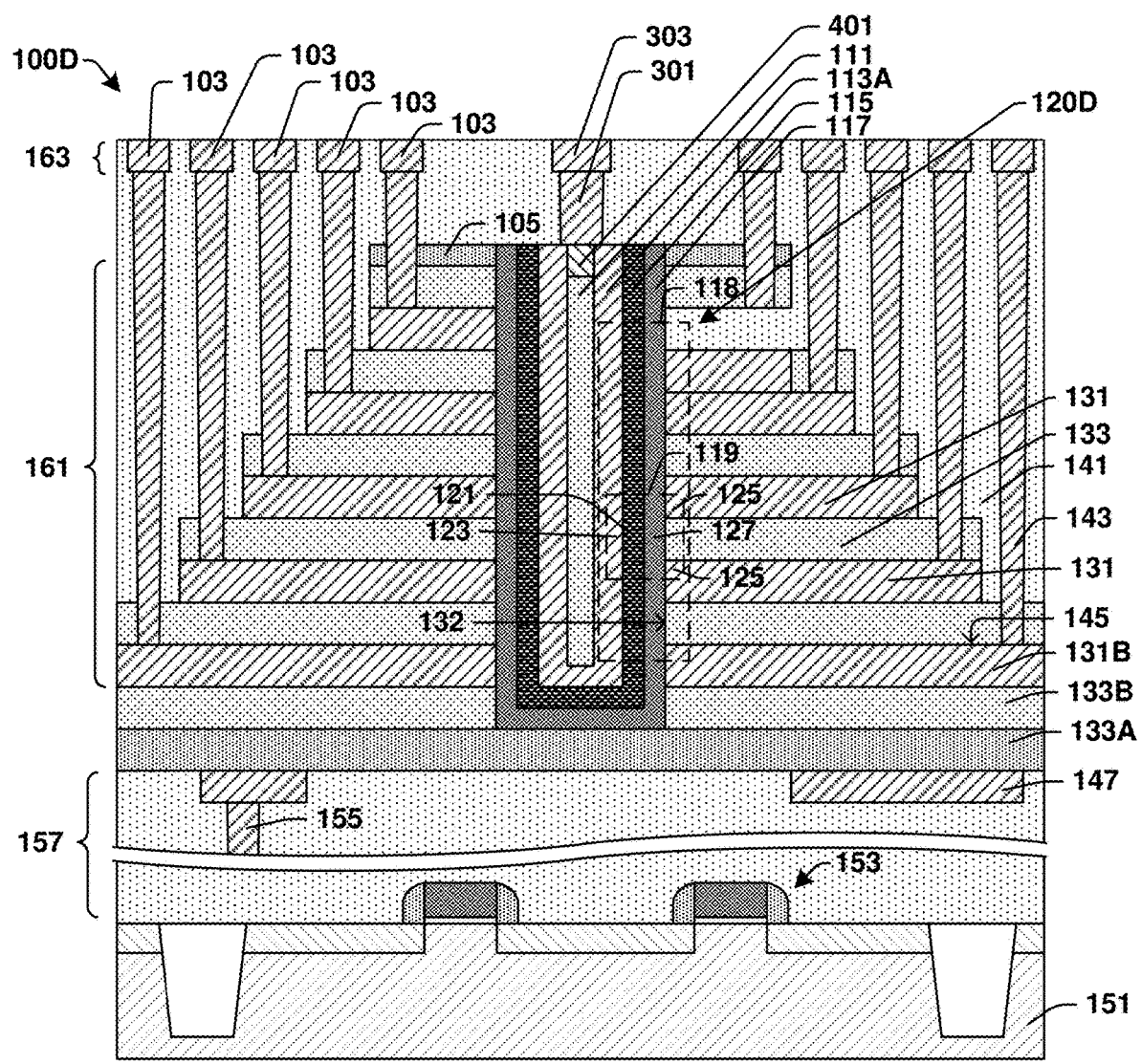

FIG. 4 illustrates a cross-sectional view of an integrated chip 100D comprising a memory device 120D that also includes FeFETs 119. The memory device 120D differs from the memory device 120C of FIG. 3 in that a conductive plug 401 fills an area that is occupied by the dielectric 111 in the memory device 120C of FIG. 3. The dielectric 111 fills a space between two branches of the control gate structure 113A. The conductive plug 401 improves electrical contact between the control gate structure 113A and the top via 301.

Figure 5:
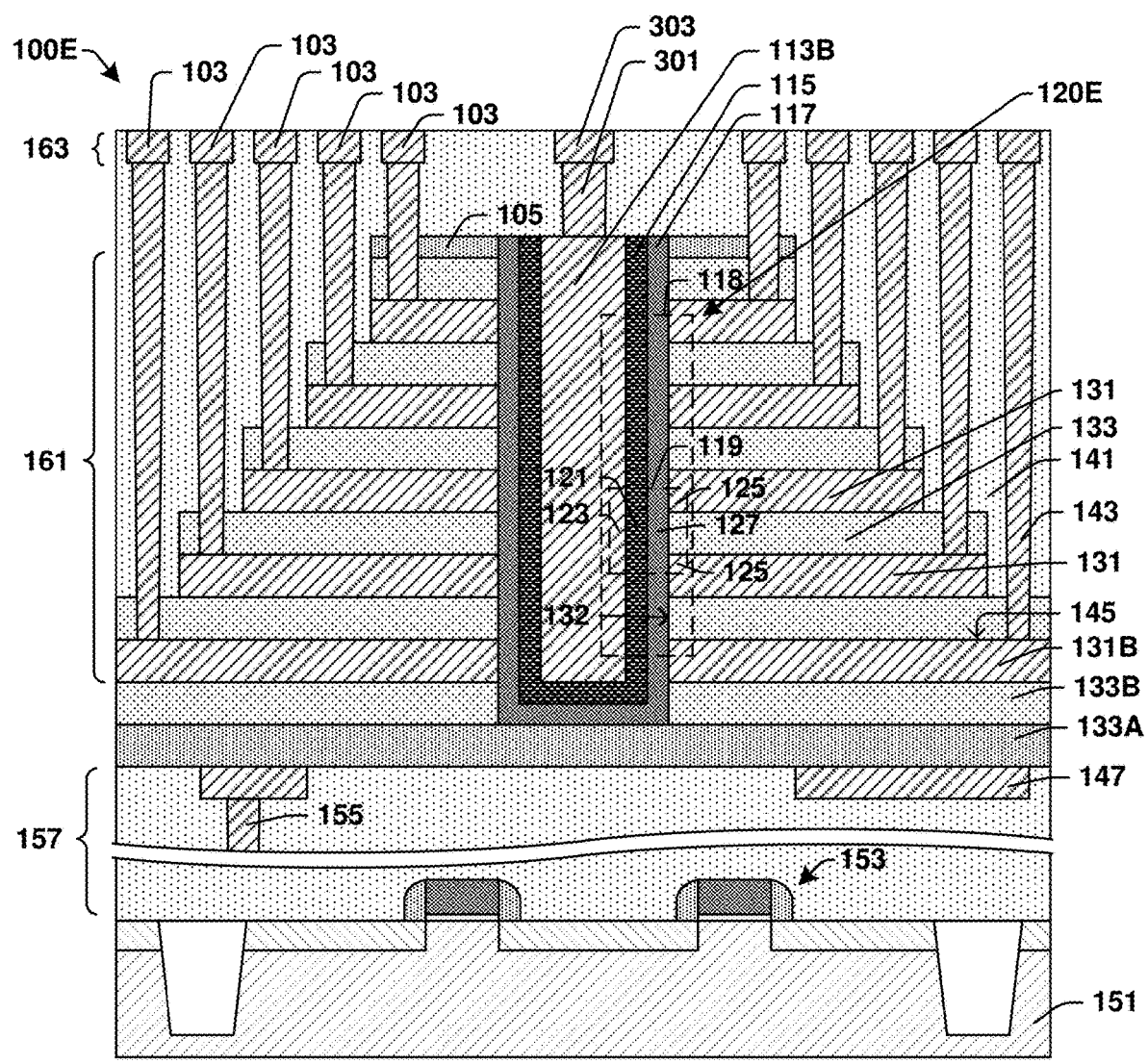

FIG. 5 illustrates a cross-sectional view of an integrated chip 100E comprising a memory device 120E that also includes FeFETs 119. The memory device 120E differs from the memory device 120C of FIG. 3 in the memory device 120E has the control gate structure 113B. The control gate structure 113B has a solid core that leave no space to be filled by the dielectric 111 (see FIG. 3). The control gate structure 113B provides contact with the top via 301 that is similar to that of the control gate structure 113A when combined with the conductive plug 401 as in the memory device 120D of FIG. 4.

Figure 6:
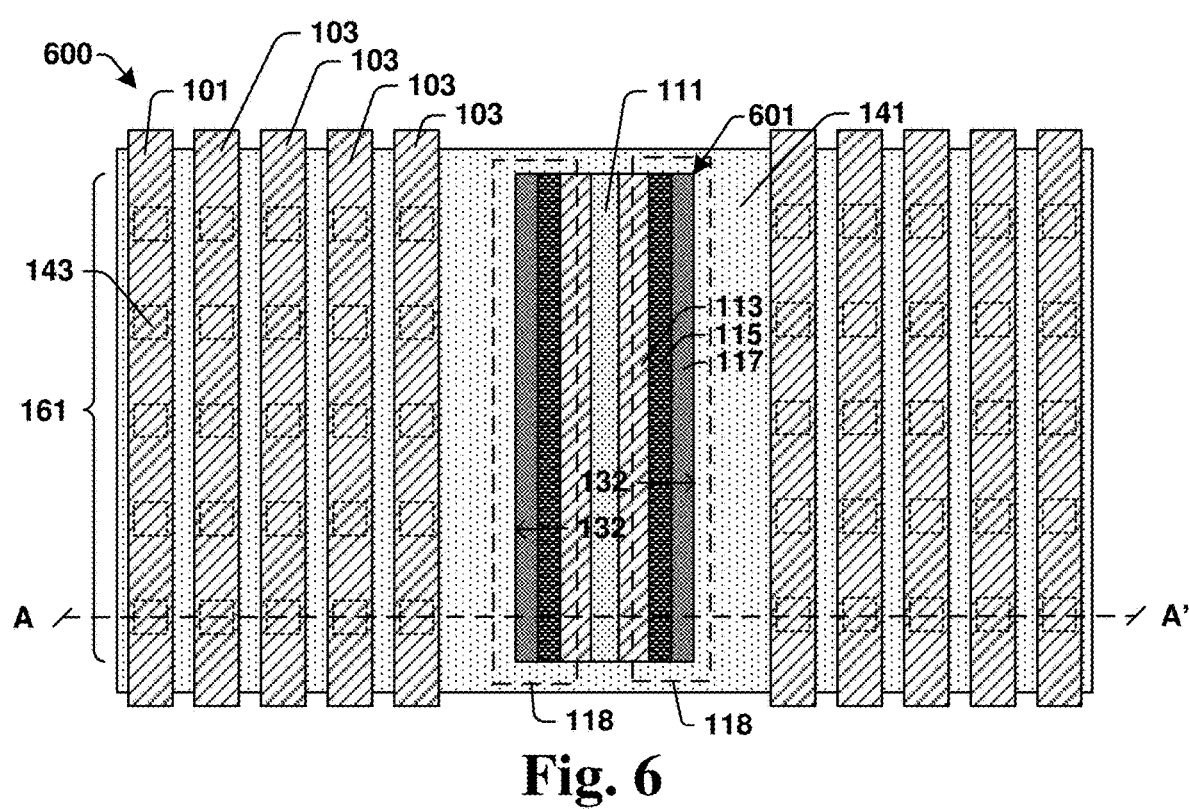
FIGS. 6-8 illustrate plan views of memory devices according to various embodiments of the present disclosure.

FIG. 6 is a plan view 600 that may correspond to the integrated chip 100A of FIG. 1 and in which the line A-A' may correspond with FIG. 1. In this embodiment, two vertical columns 118 of FeFETs 119 are formed in an area 601 that is within the stack 161. The horizontal conductive layers 131 (see FIG. 1) and the dielectric layers 133 fully surround the area 601, whereby the sidewalls 132 are internal to the stack 161. The source/drain electrodes of the FeFETs 119 in any one tier are connected in parallel. One control gate structure 113 serves both vertical columns 118 (see FIG. 1) so that the gate electrodes for the FeFETs 119 in the two vertical columns 118 are connected in parallel.

Figure 7:
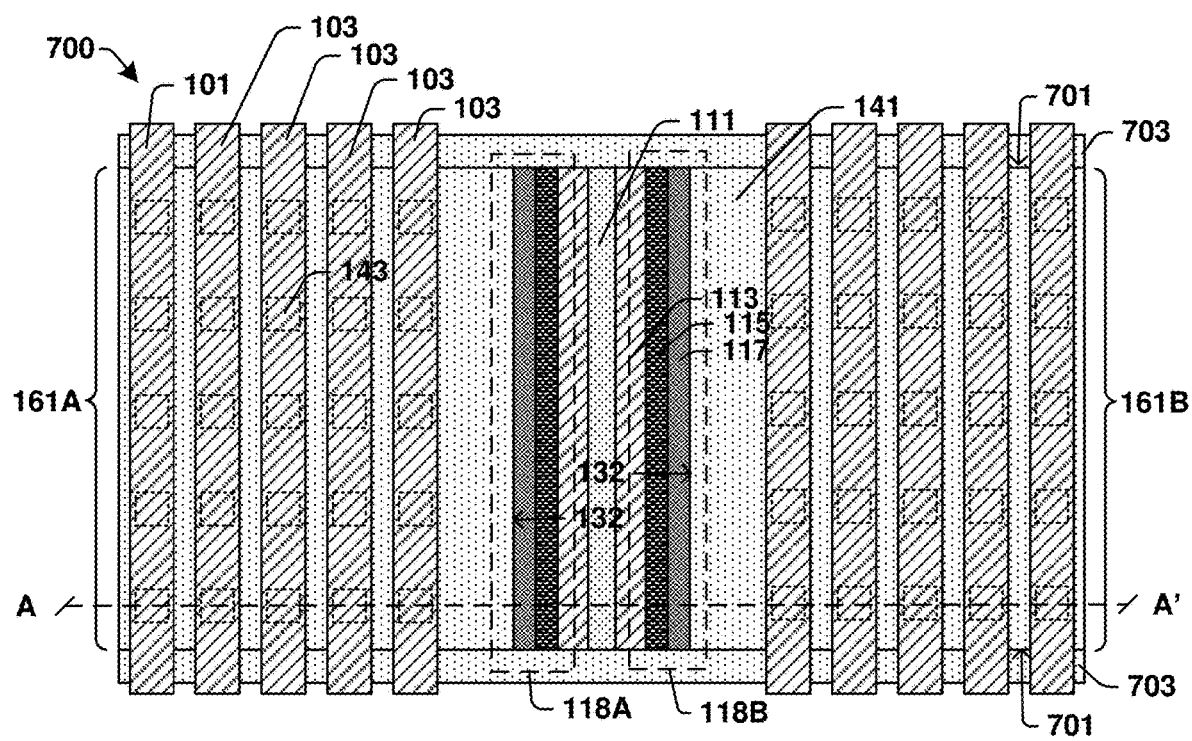

FIG. 7 is a plan view 700 which also has a line A-A' that may correspond to the cross-sectional view of the integrated chip 100A shown in FIG. 1. In the plan view 700, the stack 161A on the left side is separated from the stack 161B on the right side, whereby the source/drain electrodes for the FeFETs 119 in the vertical column 118A may be operated independently from the FeFETs 119 in the vertical column 118B. The continuous semiconductor layers 117 form vertical slabs on the sidewalls 132 of the stacks 161A and 161B. The continuous ferroelectric layers 115 form vertical slabs adjacent the continuous semiconductor layers 117.

Figure 8:
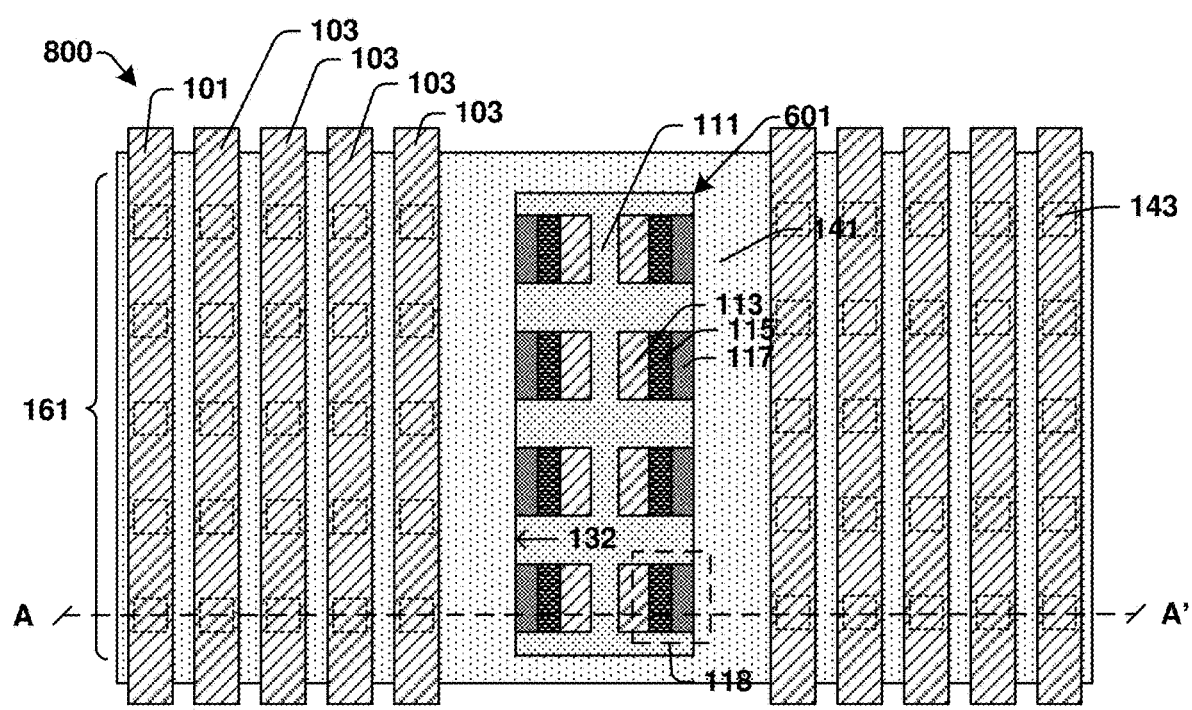
Figure 9:
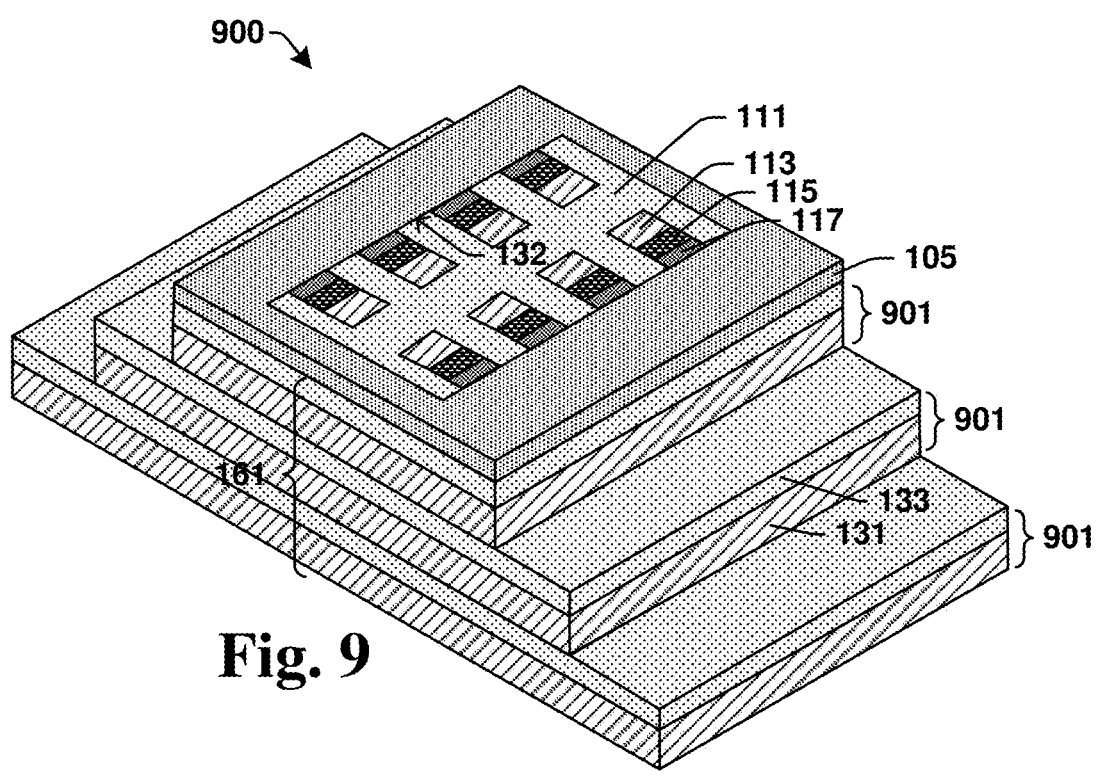
FIG. 9 is a cut-away perspective view of an upper portion of the memory device of FIG. 8.

FIG. 8 is a plan view 800, which is another plan view that may correspond to the integrated chip 100A of FIG. 1. FIG. 9 provide a corresponding cutaway perspective view 900 focusing on the three uppermost tiers 901 of the stack 161. In this embodiment, eight vertical columns 118 of FeFETs 119 are formed in the area 601 that is within the stack 161. The source/drain electrodes of the FeFETs 119 in any one tier 901 are connected in parallel. There are four control gate structures 113, each of which has a wishbone shape (see FIG. 1). The four control gate structures 113 may be coupled together through the horizontal conductive layer 131A (see FIG. 1) so that the gate electrodes for the FeFETs 119 in all eight vertical columns 118 are connected in parallel. Alternatively, the control gate structures 113 may be connected to four distinct word lines using bottom vias 201 or top vias 301 as shown in FIGS. 2 and 3.

Figure 10A:
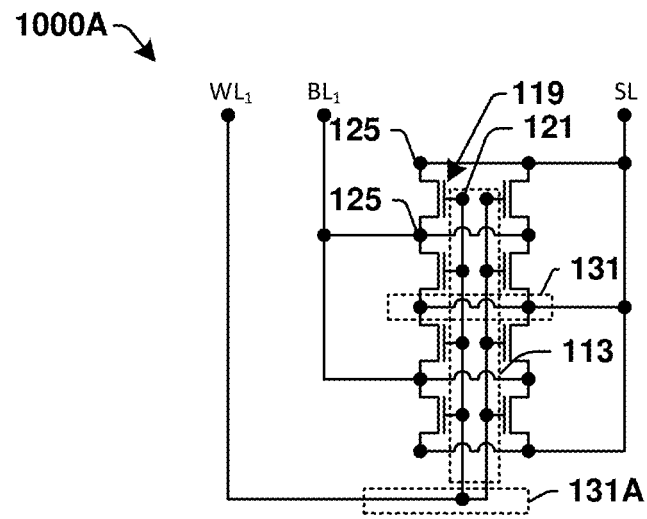
FIGS. 10A-10D and 11A-11B are circuit diagrams for memory devices according to various embodiments of the present disclosure.

FIG. 10A provides a circuit diagram 1000A for a memory device according to some embodiments. The memory device may correspond to the memory device 120A of FIG. 1 with an additional tier and the plan view 600 of FIG. 6. The control gate structure 113 may be connected to a word line WL through the horizontal conductive layer 131A. The gate electrodes 123 for all eight FeFETs 119 in the memory device are coupled to a single word line $WL_1$. Every other horizontal conductive layer 131 and their corresponding source/drain electrodes 125 may be coupled to a source line SL. The remaining horizontal conductive layers 131 and their corresponding source/drain electrodes 125 may be coupled to a bit line $BL_1$. In this configuration all eight FeFETs 119 are connected in parallel.

Figure 10B:
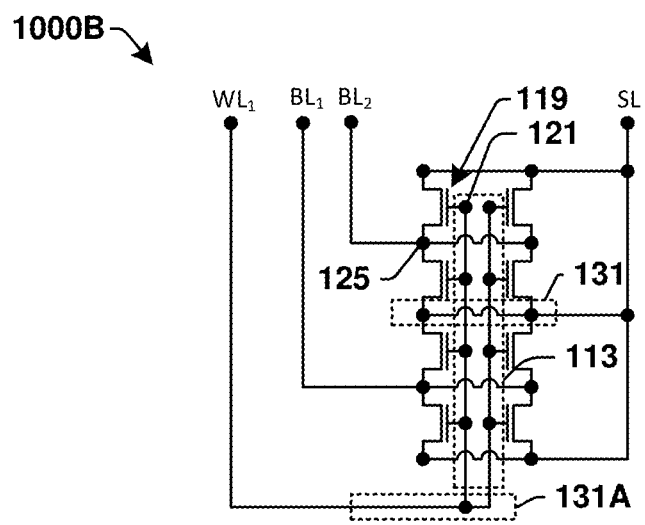

FIG. 10B provides a circuit diagram 1000B of a memory device according to some other embodiments. This memory device may also correspond to the memory device 120A of FIG. 1 with an additional tier and the plan view 600 of FIG. 6. In this example, one horizontal conductive layer 131 is coupled to the bit line $BL_1$ and another horizontal conductive layer 131 is coupled to a bit line $BL_2$ so that four of the FeFETs 119 have source/drain electrodes 125 coupled to the bit line $BL_1$ and another four of the FeFETs 119 have source/drain electrodes 125 coupled to the bit line $BL_2$. With this configuration the memory device 120A of FIG. 1 provides two sets each having four FeFETs 119 connected in parallel.

Figure 10C:
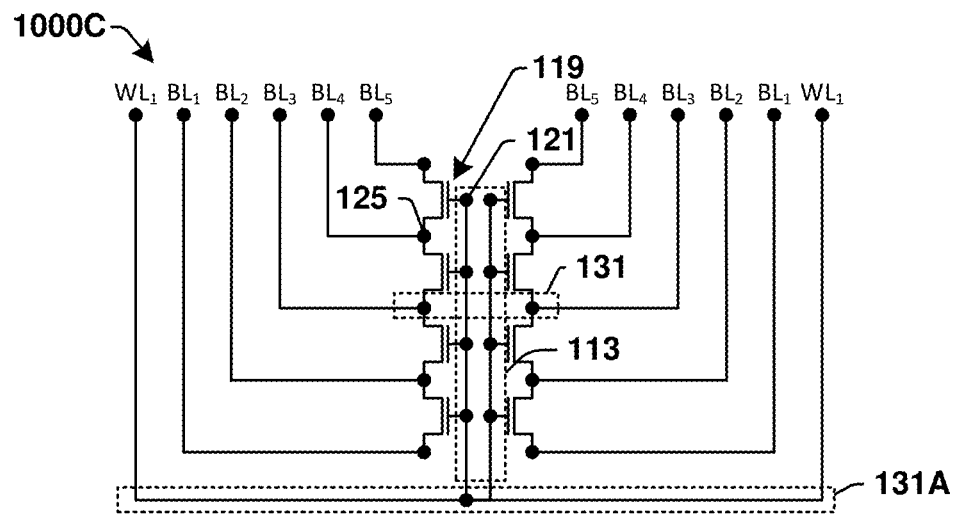

FIG. 10C provides a circuit diagram 1000C of a memory device according to some other embodiments. This memory device may also correspond to the memory device 120A of FIG. 1 with an additional tier and the plan view 600 of FIG. 6. In this example, each horizontal conductive layer 131 is coupled to a distinct one of the bit line $BL_1$, the bit line $BL_2$, a bit line $BL_3$, a bit line $BL_4$, and a bit line $BL_5$ so that the source/drain electrodes 125 in each tier may be operated independently. With this configuration the memory device 120A of FIG. 1 provides four sets each having two FeFETs 119 connected in parallel.

Figure 10D:
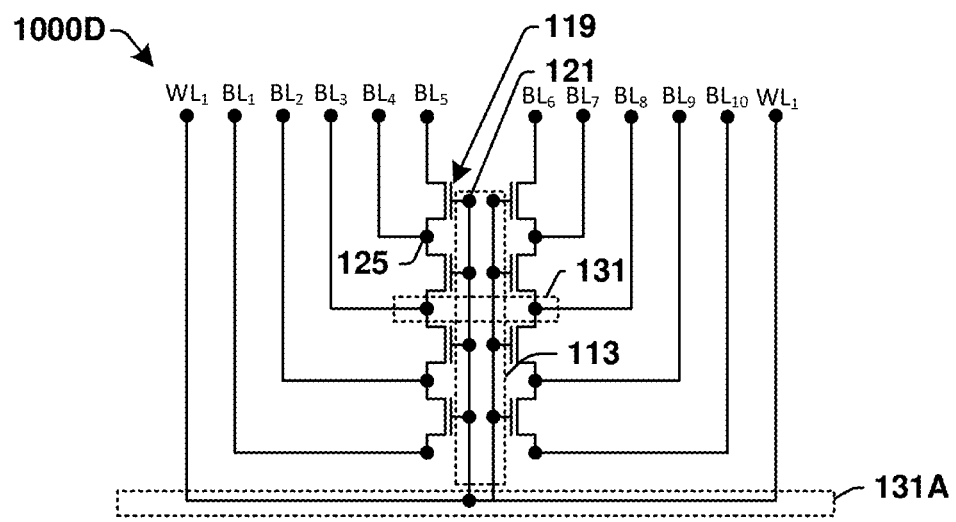

FIG. 10D provides a circuit diagram 1000D of a memory device according to some other embodiments. This memory device may correspond to the memory device 120A of FIG. 1 with an additional tier and the plan view 700 of FIG. 7. In this example, each horizontal conductive layer 131 in the stack 161A is coupled to a distinct one of the bit lines $BL_1$-$BL_5$ and each horizontal conductive layer 131 in the stack 161B is coupled to a distinct one of the bit lines $BL_6$-$BL_{10}$. With this configuration, the memory device 120A of FIG. 1 provides eight FeFETs 119 that may each be controlled independently from the others.

Figure 11A:
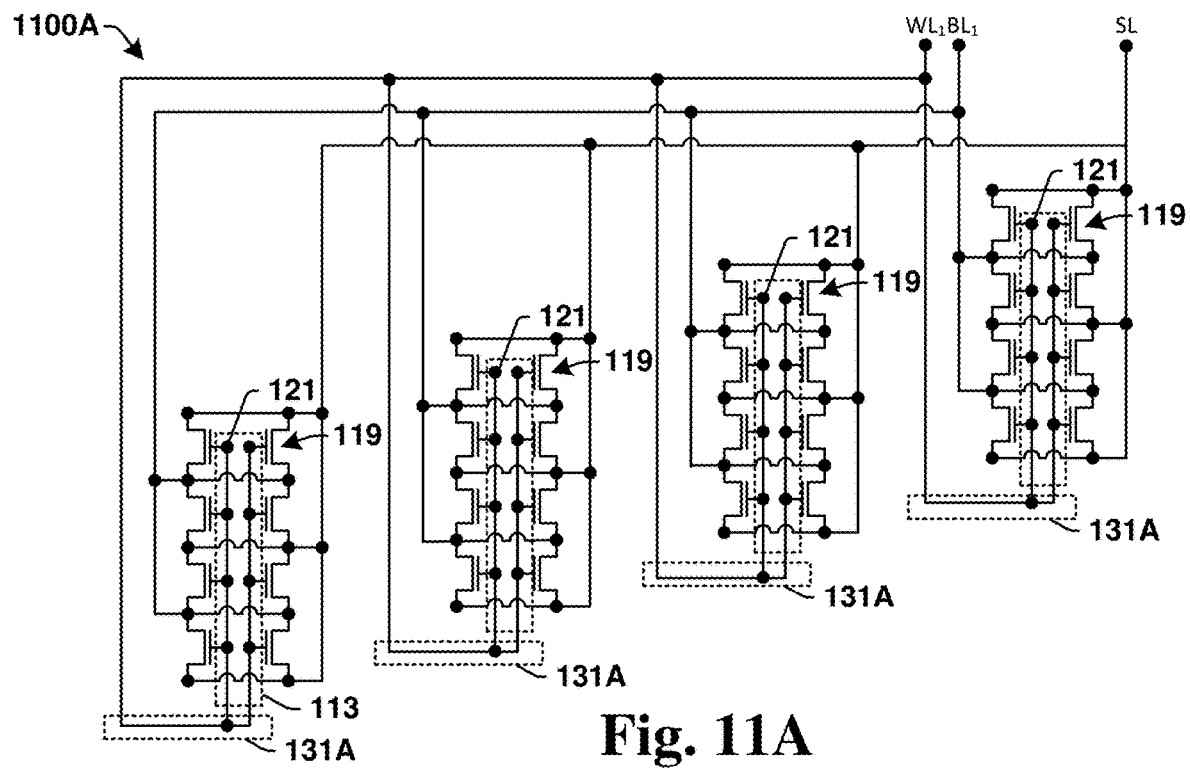

FIG. 11A provides a circuit diagram 1100A of a memory device according to some other embodiments. The memory device may correspond to the memory device 120A of FIG. 1 with an additional tier and the plan view 800 of FIG. 8. Each of the control gate structures 113 is connected to the word line $WL_1$ through the horizontal conductive layer 131A whereby the gate electrodes 123 for all 32 FeFETs 119 in the memory device are coupled to the word line $WL_1$. Every other horizontal conductive layer 131 may be coupled to a source line SL so that the source/drain electrodes 125 in those tiers are coupled to the source line SL. The remaining horizontal conductive layer 131 may be coupled to a bit line $BL_1$ so that the source/drain electrodes 125 in those tiers are coupled to the bit line $BL_1$. In this configuration all 32 FeFETs 119 are connected in parallel.

Figure 11B:
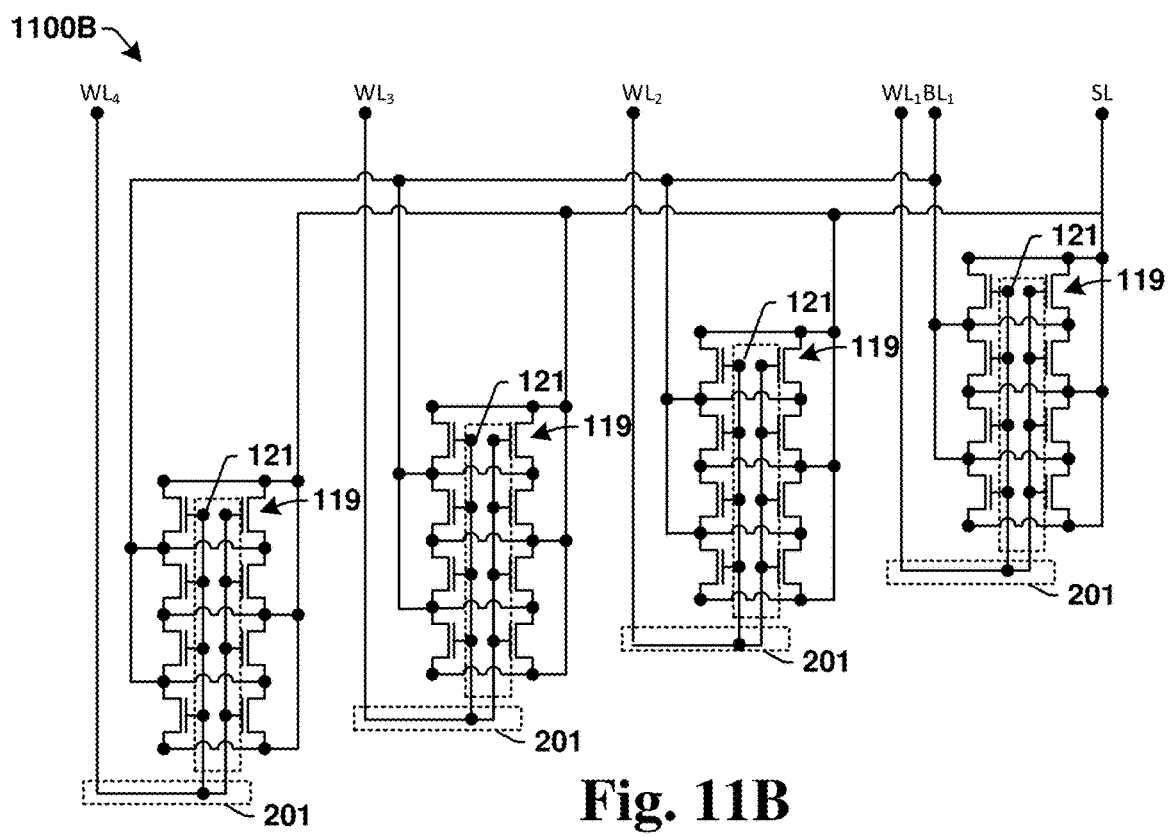

FIG. 11B provides a circuit diagram 1100B of a memory device according to some other embodiments. The memory device may correspond to the memory device 120B of FIG. 2 with the plan view 800 of FIG. 8. Each of the control gate structures 113 may be connected to a distinct one of the word lines $WL_1$-$WL_4$ through a via 201. With this configuration, the memory device 120B of FIG. 2 provides four sets each having eight FeFETs 119 connected in parallel.

FIGS. 12 through 26 are cross-sectional view illustrations exemplifying a method according to the present disclosure of forming a memory device according to the present disclosure. While FIGS. 12 through 26 are described with reference to various embodiments of a method, it will be appreciated that the structures shown in FIGS. 12 through 26 are not limited to the method but rather may stand alone separate from the method. FIGS. 12 through 26 are described as a series of acts. The order of these acts may be altered in other embodiments. While FIGS. 12 through 26 illustrate and describe a specific set of acts, some may be omitted in other embodiments. Further, acts that are not illustrated and/or described may be included in other embodiments.

Figure 12:
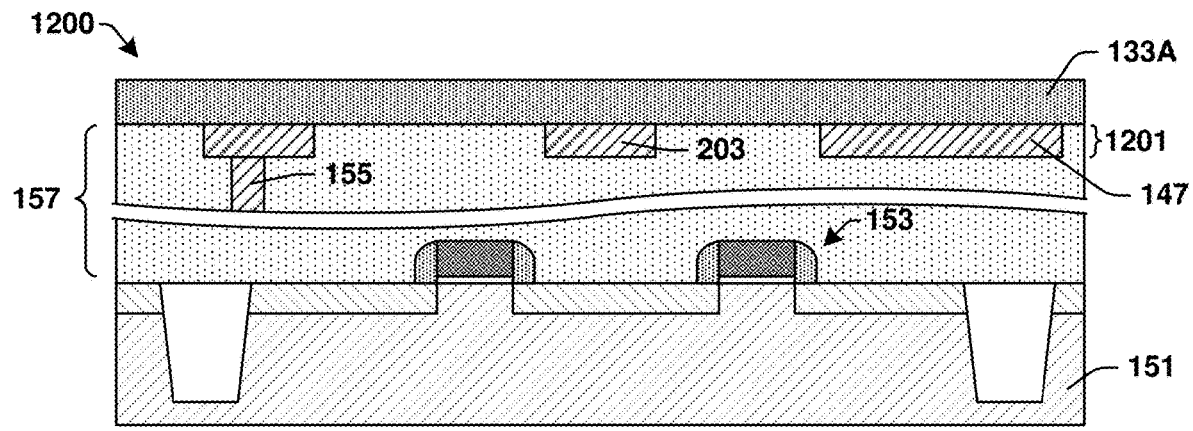
FIGS. 12 to 26 illustrate a series of cross-sectional views that show a process according to some embodiments of the present disclosure.

As shown by the cross-sectional view 1200 of FIG. 12, the method may begin with forming the dielectric layer 133A over a metallization layer 1201 of the metal interconnect 157. The metal interconnect 157 may include one or a plurality of the metallization layers 1201 at this stage of processing. Optionally, the dielectric layer 133A is formed directly on the substrate 151. The substrate 151 may be any suitable type of substrate. In some embodiments, the substrate 151 is a semiconductor substrate. A semiconductor substrate may be a bulk substrate (e.g., single crystal silicon, SiGe, etc.), a silicon-on-insulator (SOI) substrate, the like, or any other type of semiconductor substrate. In some embodiment, one or more semiconductor devices such as transistors 153 or the like are formed on the substrate 151. The metallization layers 1201 comprise wires 147. Vias 155 connect the wires 147 of adjacent metallization layers 1201. The wires 147 and the vias 155 are surrounded by interlevel dielectric 149.

The dielectric layer 133A may include one ore more layers of any suitable dielectric(s). Suitable dielectric(s) include silicon oxide (SiO), silicon carbide (SiC), silicon nitride (SiN), silicon oxycarbide (SiOC), or the like. This dielectric layer 133A may be formed by chemical vapor deposition (CVD), physical vapor deposition (PVD), atomic layer deposition (ALD), the like, a combination thereof, or any other suitable process.

Figure 13:
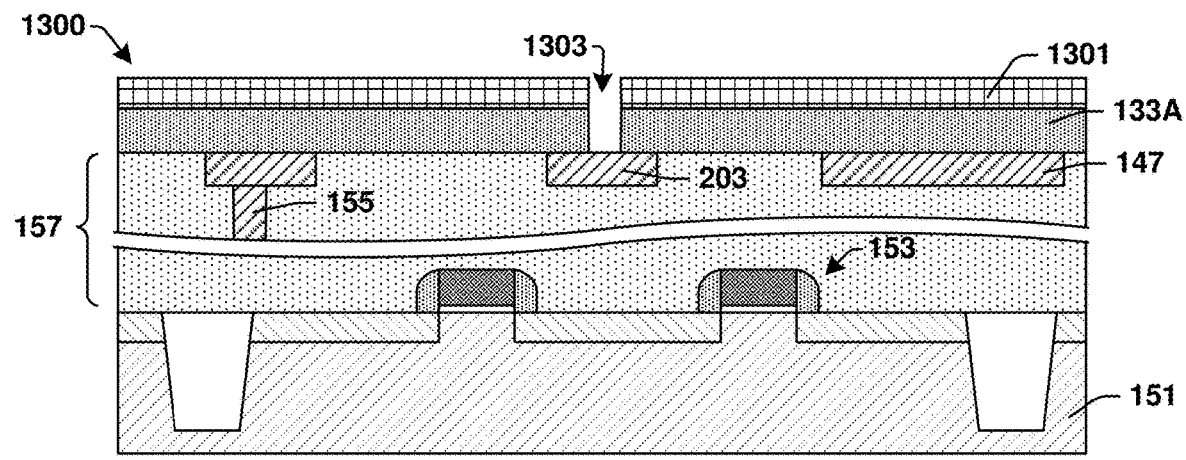

As shown by the cross-sectional view 1300 of FIG. 13, a mask 1301 may be formed and used to pattern an opening 1303 in the dielectric layer 133A. The mask 1301 may be patterned using photolithography and may be a photoresist. Patterning may comprise plasma etching, the like, or some other suitable process.

Figure 14:
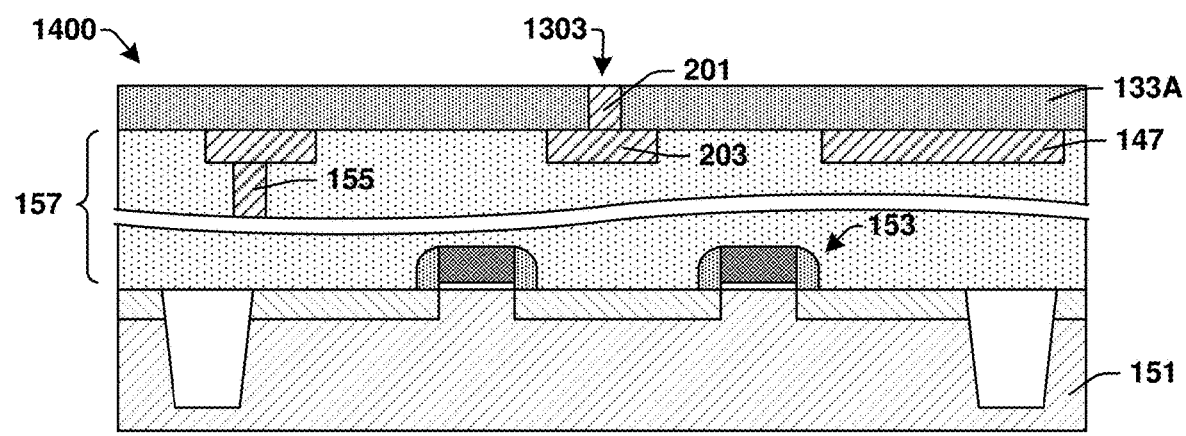

As shown by the cross-sectional view 1400 of FIG. 14, the opening 1303 may be filled with conductive material to form the bottom via 201. The bottom via 201 may have a liner that provides a diffusion barrier layer, an adhesive layer, or the like. The bottom via 201 may be or comprise one or more layers of metals such as tantalum nitride (TaN), titanium nitride (TiN), ruthenium (Ru), platinum (Pt), iridium (Jr), tungsten (W), copper (Cu), combinations thereof, the like, or some other suitable conductive material. These materials may be deposited by CVD, PVD, ALD, electroplating, electro-less plating, the like, or any other suitable process. Excess material may be removed by a planarization process such as chemical mechanical polishing (CMP). In some embodiment, the bottom via 201 is not formed. For example, the bottom via 201 is not used in the integrated chip 100A of FIG. 1.

Figure 15:
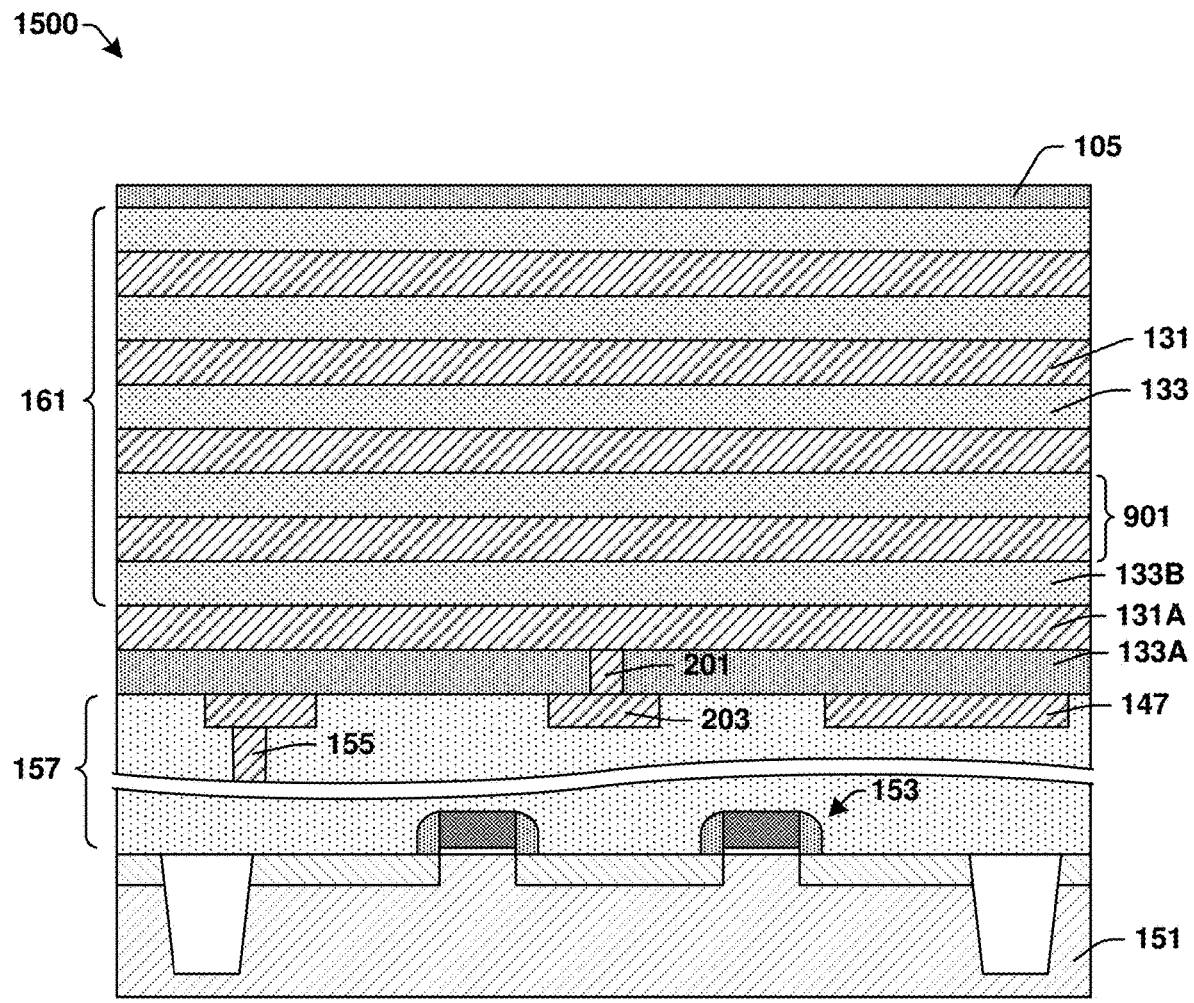

As shown by the cross-sectional view 1500 of FIG. 15, the stack 161 is formed over the dielectric layer 133A. The stack 161 is a superlattice in that it is a periodic structure that includes alternating thin layers of two distinct materials. These alternating layers include the horizontal conductive layers 131 and the dielectric layers 133. Each pair of a horizontal conductive layer 131 and a dielectric layer 133 is a tier 901. The horizontal conductive layer 131A may have a different thickness or composition from the other horizontal conductive layers 131. For example, the horizontal conductive layer 131A may have a greater thickness. In some embodiments, the horizontal conductive layer 131A is eliminated. For example, the horizontal conductive layer 131A is not used in the integrated chip 100B of FIG. 2 or the integrated chip 100C of FIG. 3.

In some embodiments, the horizontal conductive layers 131 have a thickness in the range from about 5 nm to about 50 nm. In some embodiments, the horizontal conductive layers 131 have a thickness in the range from about 5 nm to about 15 nm. In some embodiments, the horizontal conductive layers 131 have a thickness in the range from about 15 nm to about 50 nm. Thinner conductive layers allow the stack 161 to have more tiers 901. Thicker conductive layers reduce source and drain resistances.

In some embodiments, the dielectric layers 133 have a thickness in the range from about 1 nm to about 30 nm. In some embodiments, the dielectric layers 133 have a thickness in the range from about 1 nm to about 5 nm. In some embodiments, the dielectric layers 133 have a thickness in the range from about 5 nm to about 30 nm. Thinner dielectric layers allow the stack 161 to have more tiers 901. Thicker dielectric layers reduce parasitic capacitance. In some embodiments, the stack 161 has from 3 to about 64 tiers 901. In some embodiments, the stack 161 has from 3 to about 8 tiers 901. In some embodiments, the stack 161 has from about 8 to about 64 tiers 901.

The horizontal conductive layers 131 may have any suitable composition. In some embodiments, the horizontal conductive layers 131 comprise a metal or a metal compound. The metal or metal compound may be tantalum nitride (TaN), titanium nitride (TiN), ruthenium (Ru), platinum (Pt), iridium (Jr), tungsten (W), copper (Cu), combinations thereof, the like, or some other suitable conductive material. In some embodiments, the stack 161 includes diffusion barrier layers between the horizontal conductive layers 131 and the adjacent dielectric layers 133. In some embodiments, the horizontal conductive layers 131 comprises graphene or the like. Using graphene may eliminate the diffusion barrier layer to provide higher conductance when the horizontal conductive layers 131 are very thin. The horizontal conductive layers 131 may be formed by CVD, PVD, ALD, electroplating, electro-less plating, the like, or any other suitable process or processes. In some embodiments, the stack 161 is initially formed with sacrificial layers in place of the horizontal conductive layers 131. The sacrificial layers may subsequently be removed and replaced with the material of the horizontal conductive layers 131 by etching and deposition via trenches or holes in the stack 161.

The dielectric layers 133 may have any suitable composition. In some embodiment, the dielectric layers 133 are or include an oxide such as silicon dioxide ($SiO_2$). In some embodiment, the dielectric layers 133 include a high-K dielectric. In some embodiment, the dielectric layers 133 include a low-K dielectric. The dielectric layers 133 may be formed by CVD, PVD, ALD, the like, or any other suitable process. ALD provides the advantage of precise control over the thickness of the dielectric layers 133 and thereby improves uniformity in the lengths of channels 127 (see FIG. 1).

As further shown by the cross-sectional view 1500 of FIG. 15, the hard mask 105 may be formed over the stack 161. The hard mask 105 may be silicon nitride (SiN), silicon carbide (SiC), silicon carbonitride (SiCN), silicon oxycarbide (SIOC), silicon oxycarbonitiride (SiOCN), a combination thereof, the like, or any other suitable hard mask material. At this stage of processing, isolation structures 703 as shown in FIG. 7 may be formed in the stack 161s. Forming the isolation structures 703 may include patterning the hard mask 105, etching trenches in the stack 161, filing the trenches with a dielectric such as an oxide, and CMP to remove excess dielectric.

Figure 16:
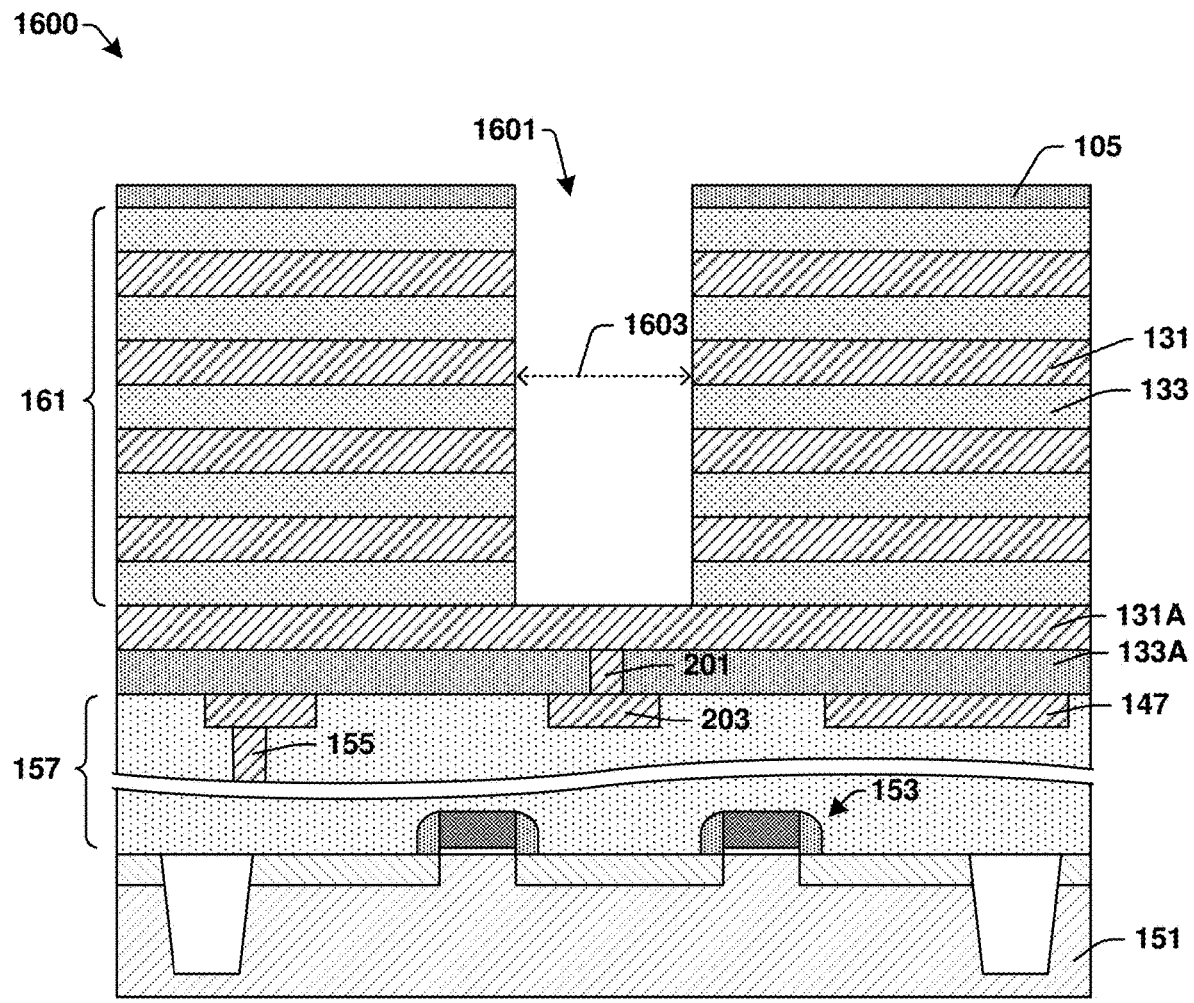

As shown by the cross-sectional view 1600 of FIG. 16, the process may continue with patterning (or further patterning) the hard mask 105 and using the hard mask 105 to etch trenches 1601 in the stack 161. Etching may be plasma etching, the like, or any other suitable process. In some embodiments, the trench 1601 has a width 1603 in the range from about 10 nm to about 100 nm. In some embodiments, the width 1603 is from about 10 nm to about 30 nm. In some embodiments, the width 1603 is from about 30 nm to about 100 nm. The trench 1601 may have any suitable length. In some embodiments, the trench 1601 divides the stack 161 in two as is shown in the plan view 700 of FIG. 7. In some embodiments, the conductive layers 131 on opposite sides of the trench 1601 remain united as they are in the cutaway perspective view 900 of FIG. 9.

Figure 17:
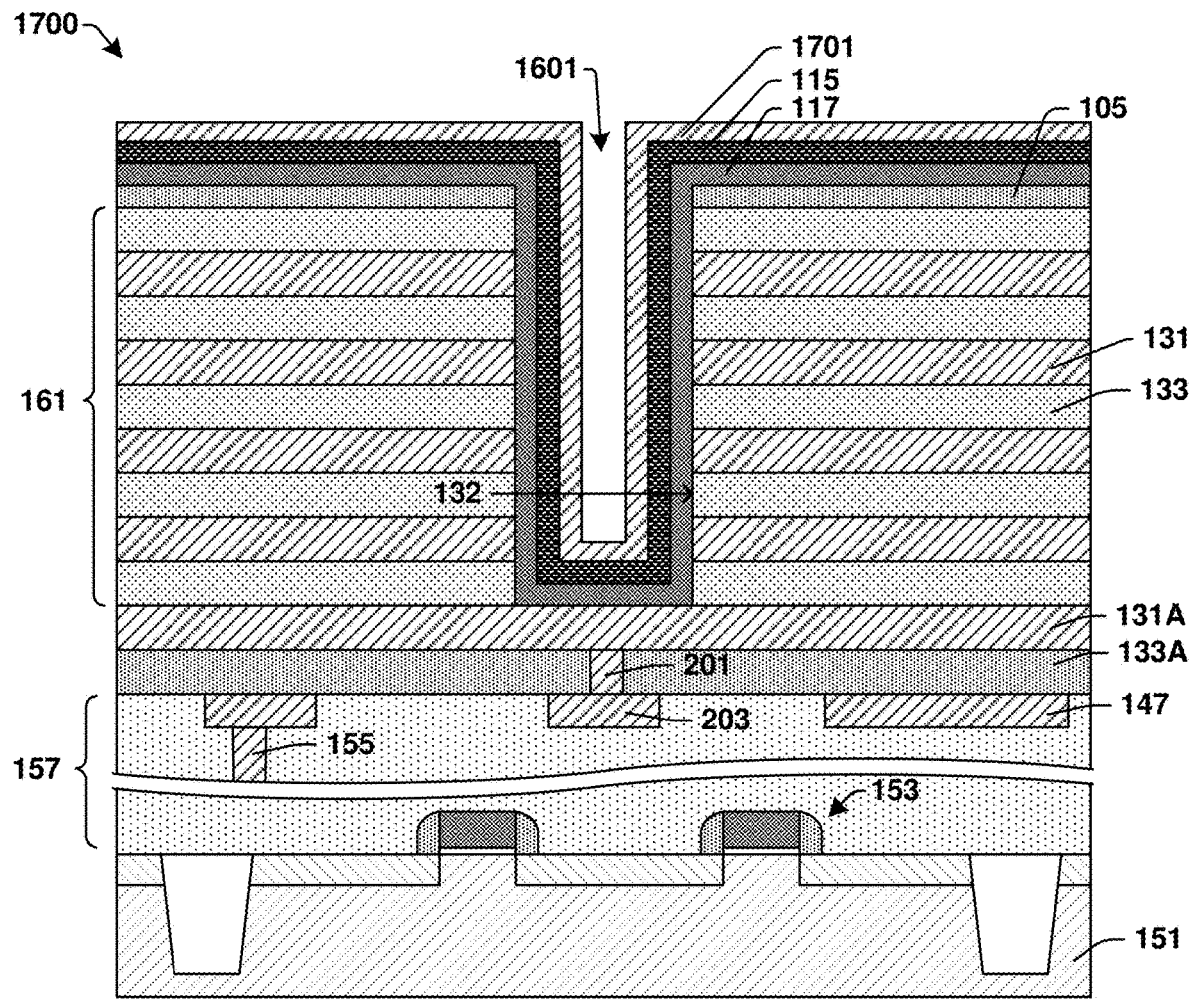

As shown by the cross-sectional view 1700 of FIG. 17, a series of layers are deposited so as to line the sidewalls 132 of the trench 1601. These layers may include the continuous semiconductor layer 117, the continuous ferroelectric layer 115, and a conductive layer 1701. In some embodiments the sidewalls 132 are planar and the continuous semiconductor layer 117 forms planar slabs on the sidewalls 132. The continuous ferroelectric layer 115 may also form planar slabs along the sidewalls 132. In some embodiments, the continuous ferroelectric layer 115 is in direct contact with the continuous semiconductor layer 117. In some embodiments, they are separated by a thin insulating layer (not shown).

The continuous semiconductor layer 117 may be any semiconductor that may be formed by deposition. In some embodiments, the semiconductor is an oxide semiconductor or the like. The oxide semiconductor may be, for example, indium gallium zinc oxide (InGaZnO or IGZO), indium oxide (InO), nickel oxide (NiO), tin oxide (SnO), cuprous oxide (CuO), indium zinc oxide (InZnO), indium gallium zinc tin oxide (InGaZnSnO or IGZTO), zinc oxide (ZnO), indium tungsten oxide (InWO), indium tin oxide (InSnO or ITO), a combination thereof, or the like. In some embodiments, the continuous semiconductor layer 117 has a thickness in the range from about 1 nm to about 10 nm. In some embodiments, the continuous semiconductor layer 117 has a thickness in the range from about 1 nm to about 3 nm. In some embodiments, the continuous semiconductor layer 117 has a thickness in the range from about 3 nm to about 10 nm. If the continuous semiconductor layer 117 is too thin, channel resistance may be excessive. If the continuous semiconductor layer 117 is too thick, the threshold voltages of the FeFETs 119 may be too high. The continuous semiconductor layer 117 may be deposited by CVD, PVD, ALD, the like, or any other suitable process.

The continuous ferroelectric layer 115 may be any ferroelectric material that has polarization states suitable for data storage. Examples of ferroelectric materials that may be suitable include hafnium oxide (HfO), hafnium silicon oxide (HfSiO), hafnium zirconium oxide (HfZrO or HZO), a perovskite such as calcium titanate (CaTiO), a wurtzite such as zinc iron sulfide (ZnFeS), aluminum oxide (AlO), titanium oxide (TiO), lanthanum oxide (LaO), strontium barium titanate (SrBaTiO or SBT), lead zirconium titanate (PbZrTiO or PZT), barium lanthanum titanate (BaLaTiO or BLT), and the like. In some embodiments, the continuous ferroelectric layer 115 has a thickness in the range from about 5 nm to about 20 nm. In some embodiments, the continuous ferroelectric layer 115 has a thickness in the range from about 5 nm to about 10 nm. In some embodiments, the continuous ferroelectric layer 115 has a thickness in the range from about 10 nm to about 20 nm. If the continuous ferroelectric layer 115 is too thin it may not be effective for data storage. If the continuous ferroelectric layer 115 is too thick the programming voltages of the FeFETs 119 may be too high. The continuous ferroelectric layer 115 may be deposited by CVD, PVD, ALD, the like, or any other suitable process.

The conductive layer 1701 may be a metal or metal compound such as tantalum nitride (TaN), titanium nitride (TiN), ruthenium (Ru), platinum (Pt), iridium (Jr), tungsten (W), copper (Cu), a combination thereof, the like, or some other suitable conductive material. In some embodiments, the conductive layer 1701 has a thickness in the range from about 5 nm to about 50 nm. In some embodiments, the conductive layer 1701 has a thickness in the range from about 5 nm to about 15 nm. In some embodiments, the conductive layer 1701 has a thickness in the range from about 15 nm to about 50 nm. The conductive layer 1701 may be deposited by CVD, PVD, ALD, electroplating, electroless plating, the like, or any other suitable process.

Figure 18:
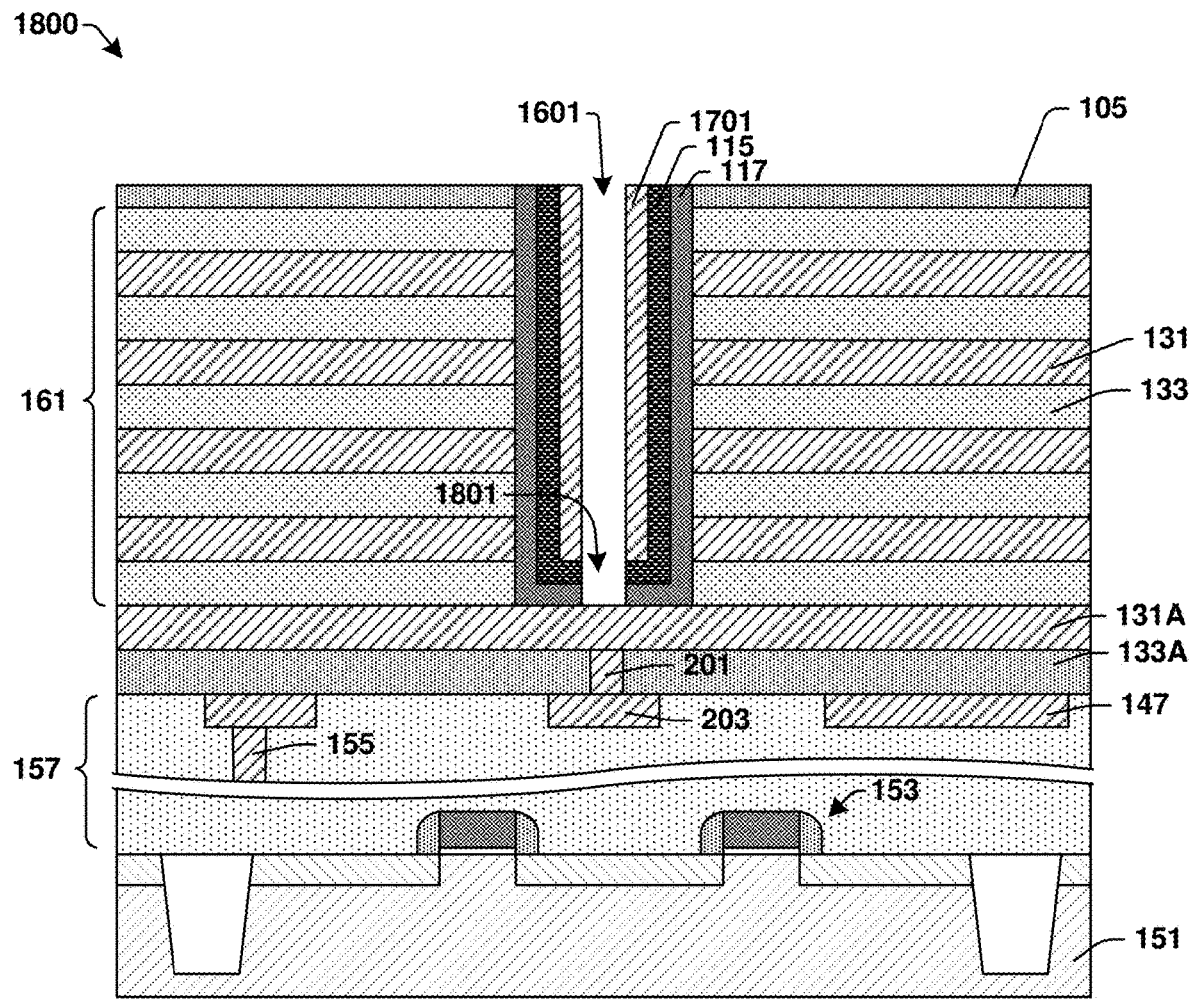

As shown by the cross-sectional view 1800 of FIG. 18, an etch may be carried out to form an opening 1801 through the conductive layer 1701, the continuous semiconductor layer 117, and the continuous ferroelectric layer 115 at the bottom of the trench 1601. This etch will also remove the conductive layer 1701, the continuous semiconductor layer 117, and the continuous ferroelectric layer 115 from the top of the stack 161. In some embodiments, the horizontal conductive layer 131A is exposed through the opening 1801. In some embodiments, the bottom via 201 is exposed through the opening 1801. The etch may be a plasma etch or the like. In some embodiments, this etch is carried out without a mask. In some embodiments, this etch is not used. For example, this etch would not be used to form the integrated chip 100C of FIG. 3.

Figure 19:
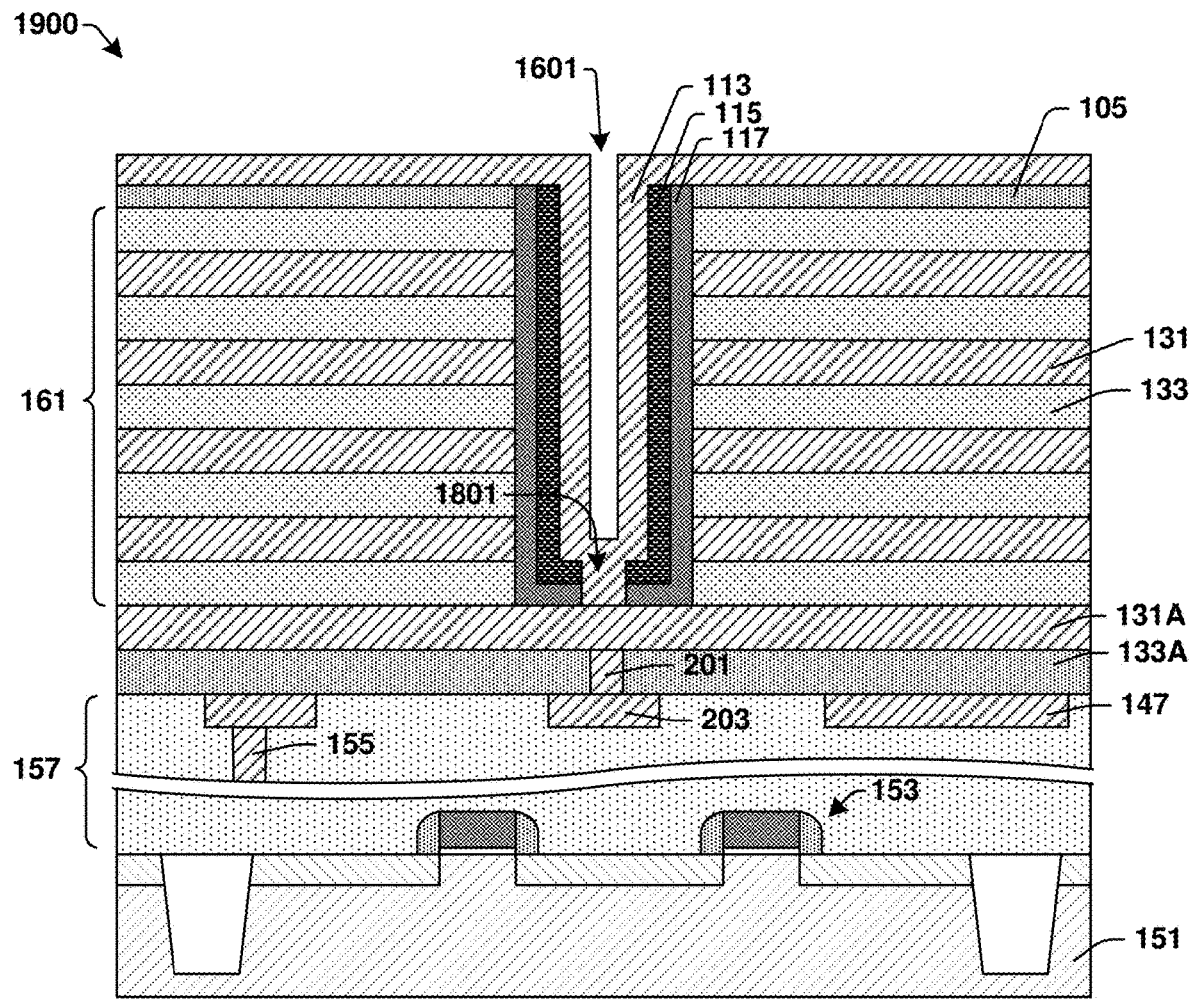

As shown by the cross-sectional view 1900 of FIG. 19 a second layer of conductive material may be deposited to complete formation of the control gate structure 113. In some embodiments, the conductive material deposits in the opening 1801 to form a contact with the horizontal conductive layer 131A or the bottom via 201. In some embodiments, the second conductive layer completely fills the trench 1601 to produce the control gate structure 113B of FIG. 3 or the like. The conductive material and the method by which it is deposited may be the same or different as that used for the conductive layer 1701 of FIG. 17.

Figure 20A:
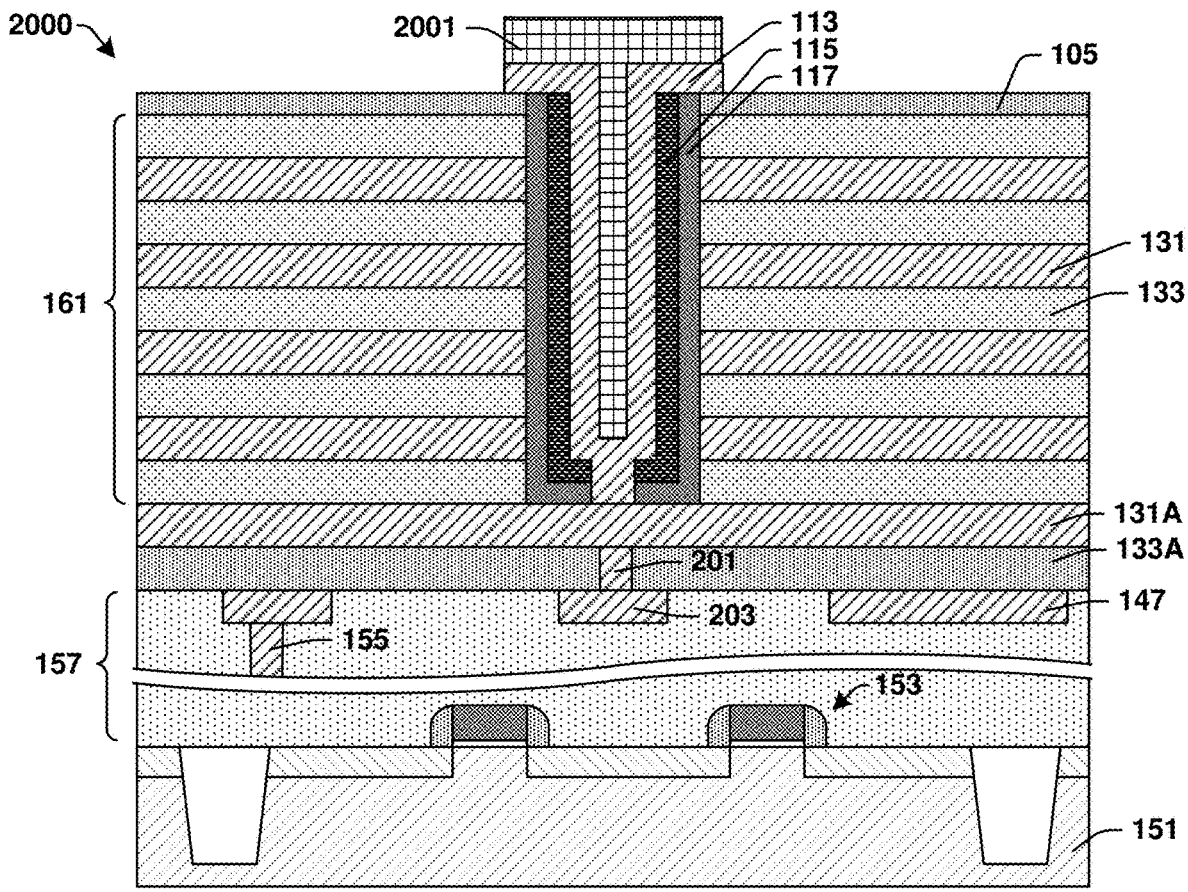
Figure 20B:
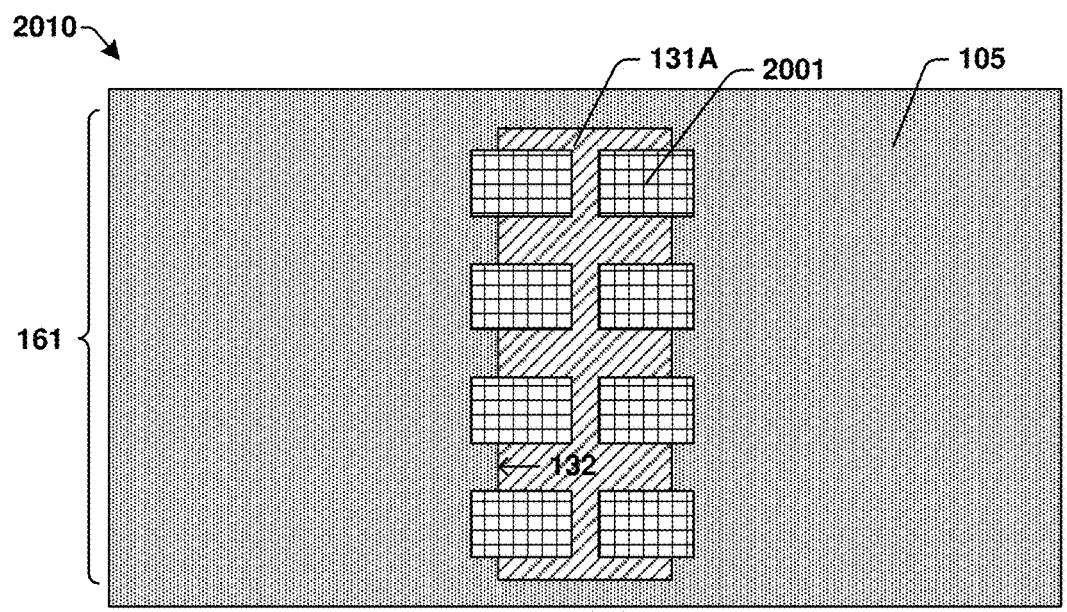

As shown by the cross-sectional view 2000 of FIG. 20A and the plan view 2010 of FIG. 20B, a mask 2001 may be formed and used to pattern the control gate structure 113. This patterning may be used to divide the control gate structure 113 into a plurality of side-by-side control gate structures 113 of the type shown in the plan view 800 of FIG. 8 and the cutaway perspective view 900 of FIG. 9. In some embodiments, this patterning also divides the continuous ferroelectric layer 115 and the continuous semiconductor layer 117. The division may be used to increase the number of FeFETs 119 that are formed while reducing the size of each FeFET 119. In some embodiments, the control gate structure 113 is divided into two or more side-by-side control gate structures 113. In some embodiments, the control gate structure 113 is divided into four or more side-by-side control gate structures 113. In some embodiments, the control gate structure 113 is divided into eight or more side-by-side control gate structures 113. The control gate structures 113 thus formed are aligned in a row. Each may be wishbone shaped. After etching, the mask 2001 may be stripped.

Figure 21:
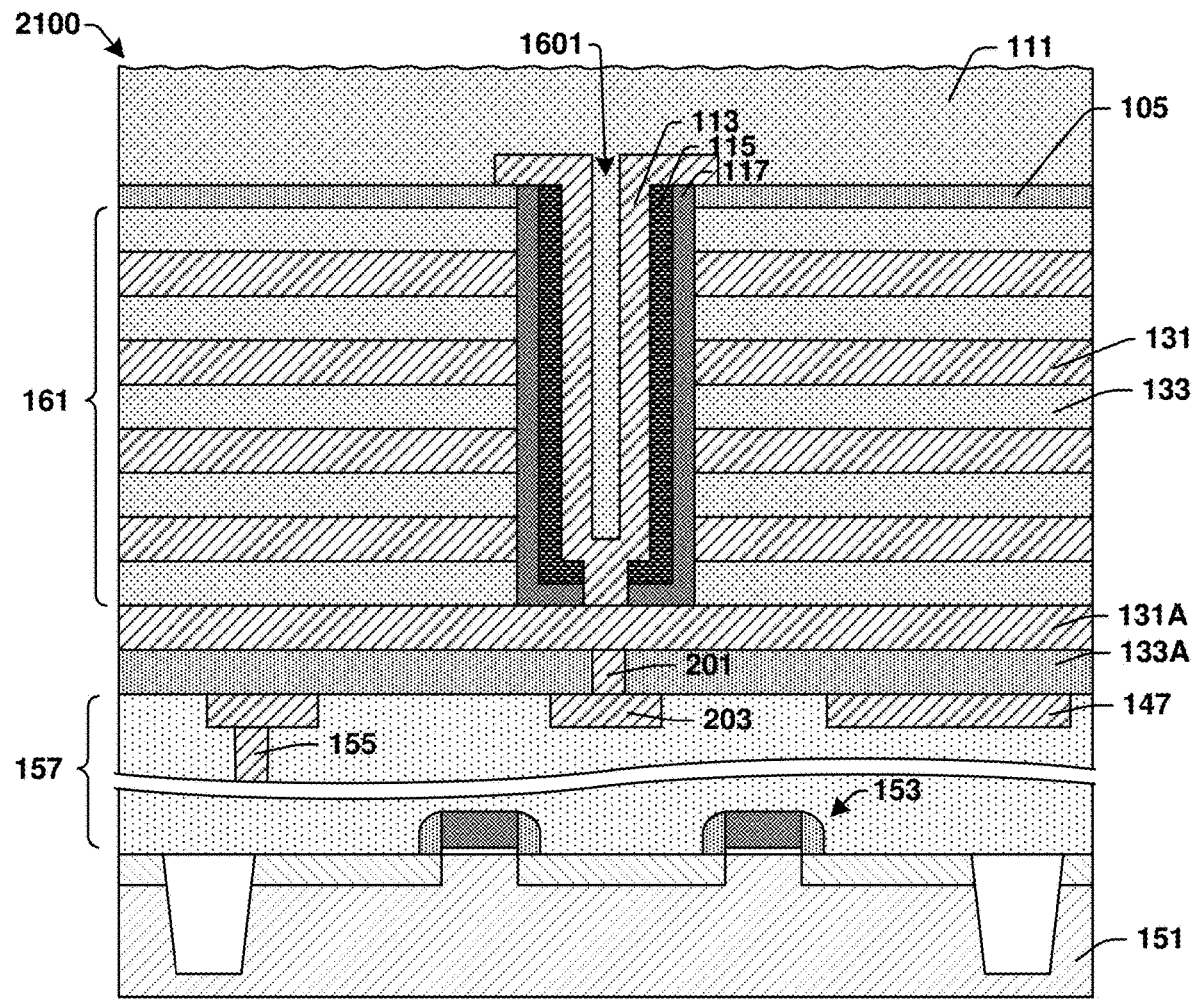
Figure 22:
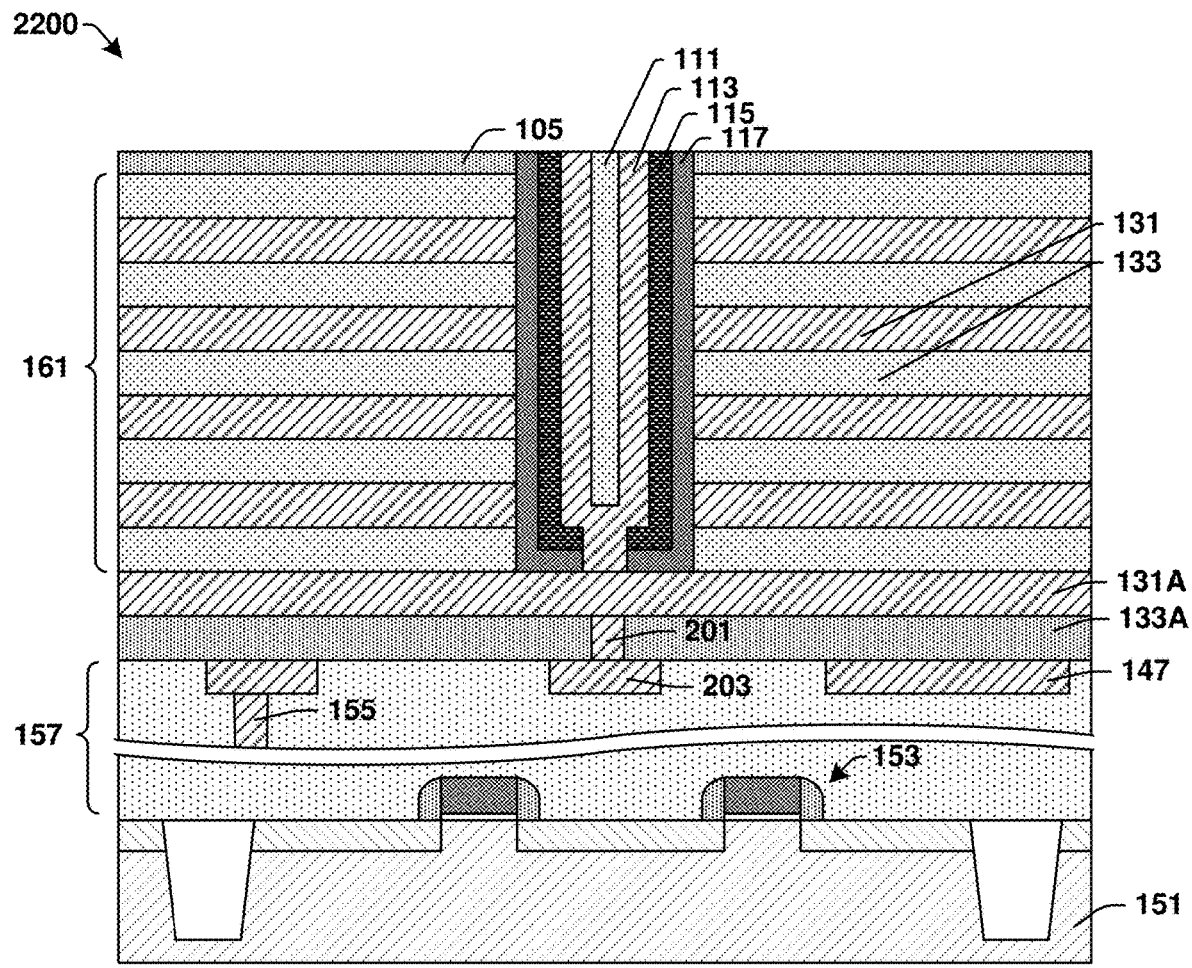

As shown by the cross-sectional view 2100 of FIG. 21, the dielectric 111 may be deposited so as to fill any remaining space in the trench 1601. The dielectric 111 may be any suitable dielectric. In some embodiments, the dielectric 111 is an oxide or the like. The dielectric 111 may be deposited by CVD, PVD, ALD, or any other suitable process. As shown by the cross-sectional view 2200 of FIG. 22, a planarization process may be carried out to remove an excess portion of the dielectric 111. The planarization process may be CMP or the like.

Figure 23:
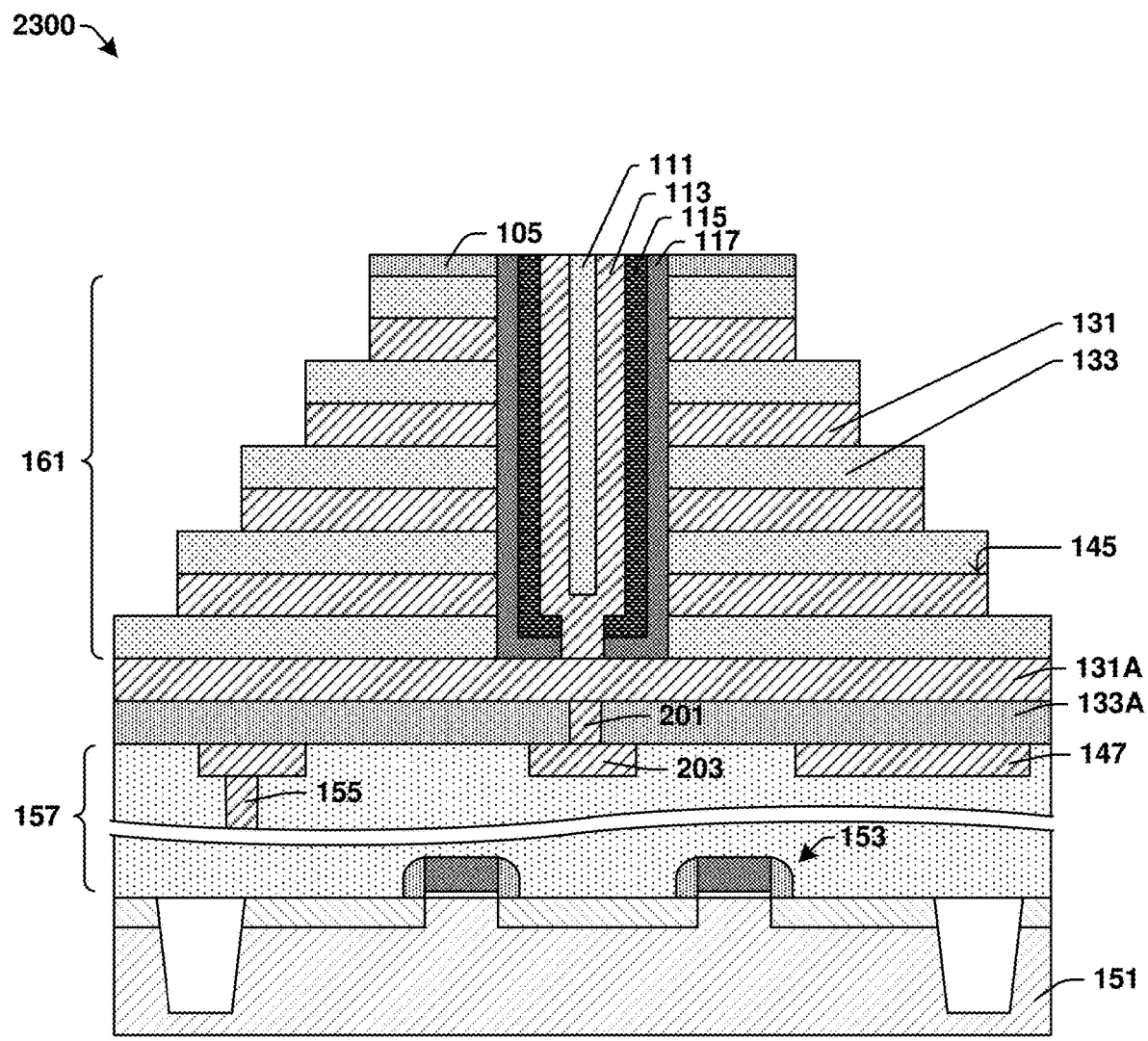

As shown by the cross-sectional view 2300 of FIG. 23, a series of masking and etching operations may be carried out to form a staircase pattern in the sides of the stack 161. The etches may stop on the dielectric layers 133 or on the horizontal conductive layers 131. The etching provides each of the horizontal conductive layers 131 with a ledge 145 that has no other horizontal conductive layers 131 directly above it.

Figure 24:
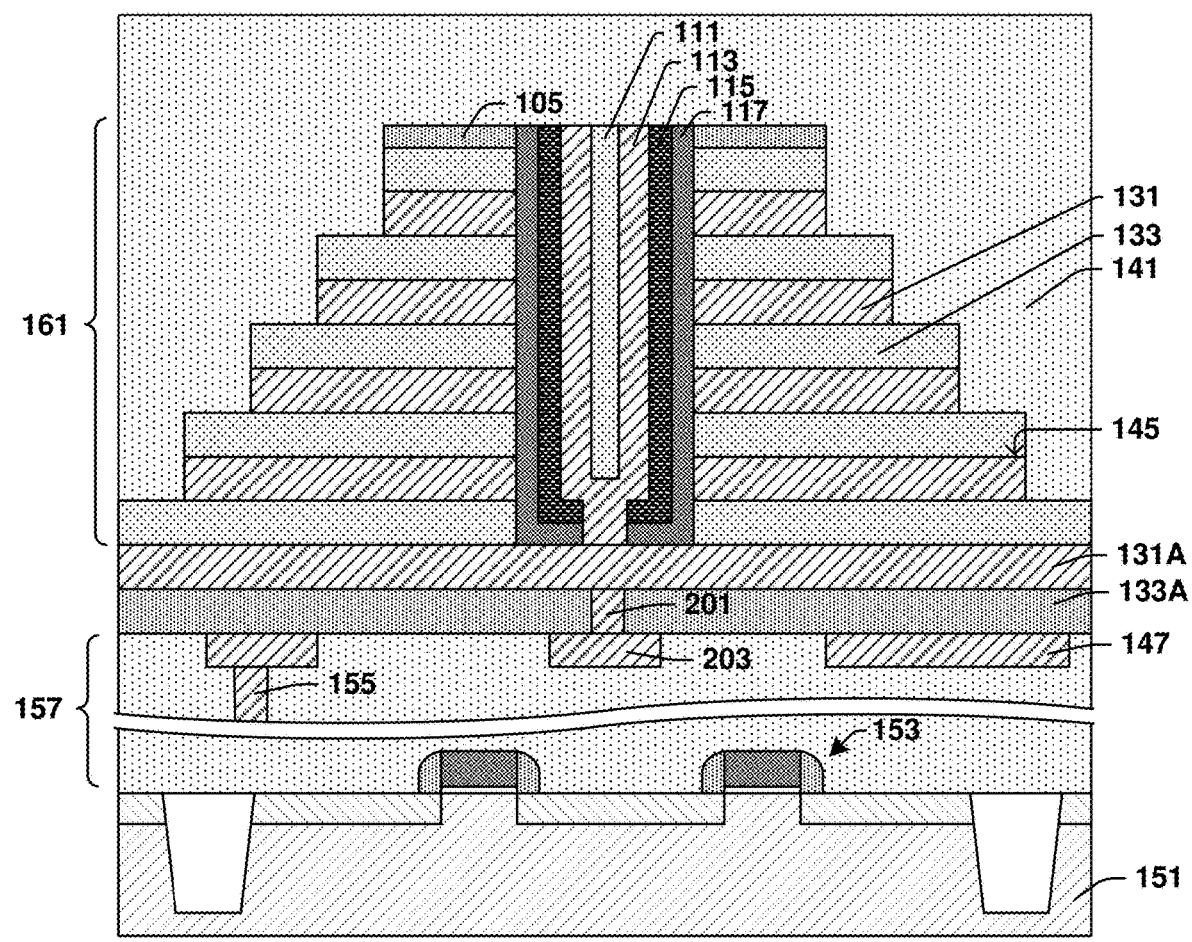

As shown by the cross-sectional view 2400 of FIG. 24, the interlevel dielectric layer 141 may be deposited over the structure shown by the cross-sectional view 2300 of FIG. 23. The interlevel dielectric layer 141 may be any suitable dielectric. In some embodiments, the interlevel dielectric layer 141 is silicon oxide (SiO). In some embodiments, the interlevel dielectric layer 141 is a low-K dielectric. In some embodiments, the interlevel dielectric layer 141 has a composition distinct from that of the dielectric 111. In some embodiments, the interlevel dielectric layer 141 has a lower dielectric constant than the dielectric 111.

Figure 25:
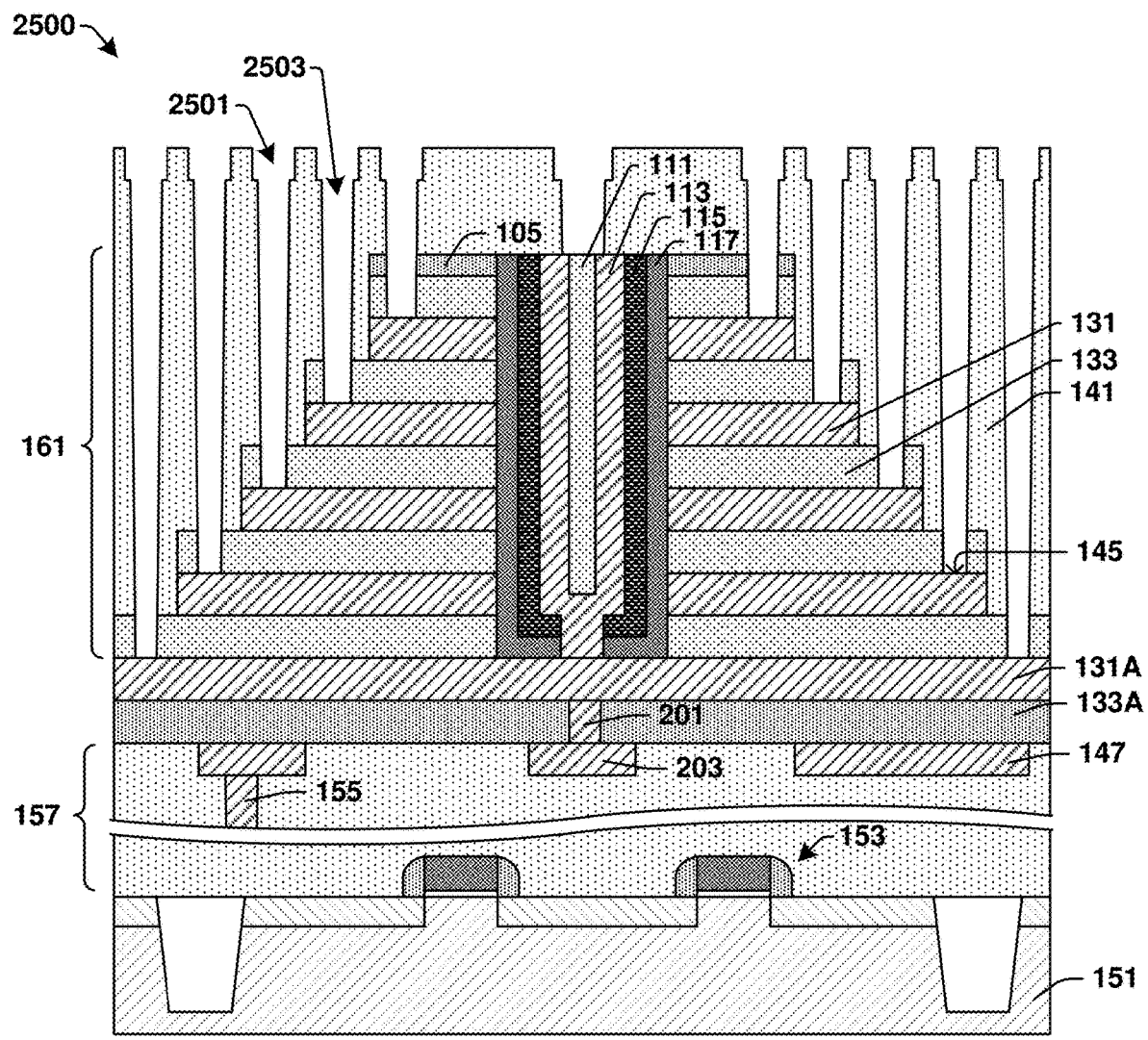

As shown by the cross-sectional view 2500 of FIG. 25, trenches 2501 and holes 2503 may be formed in the interlevel dielectric layer 141. As shown by the cross-sectional view 2600 of FIG. 26, the trenches 2501 and the holes 2503 may be filled with conductive material to form the wires 101, the wires 103, and the vias 143. These structures may be formed in a dual damascene process, which may be a trench-first process or a hole-first process.

Figure 26:
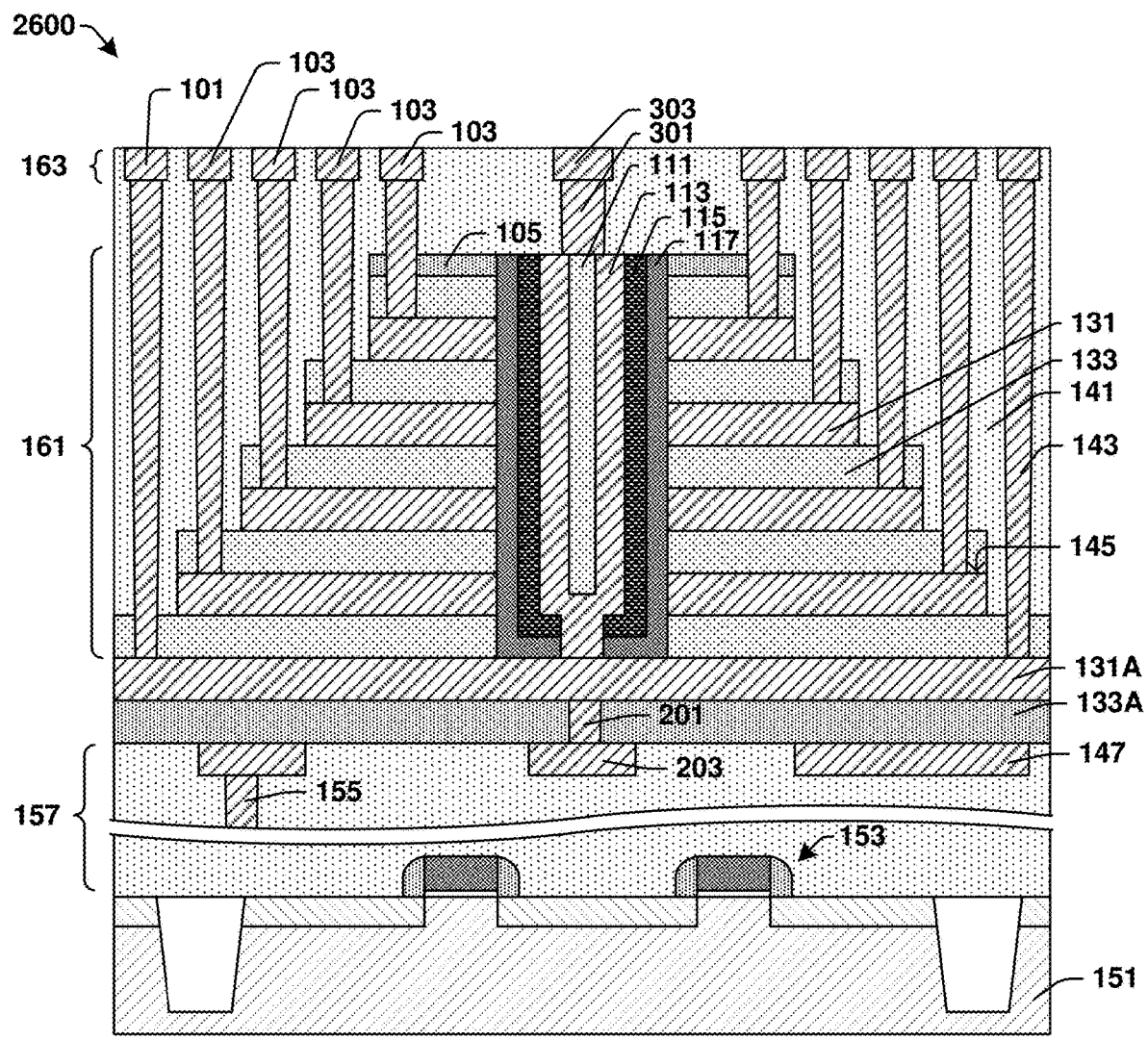
Figure 27:
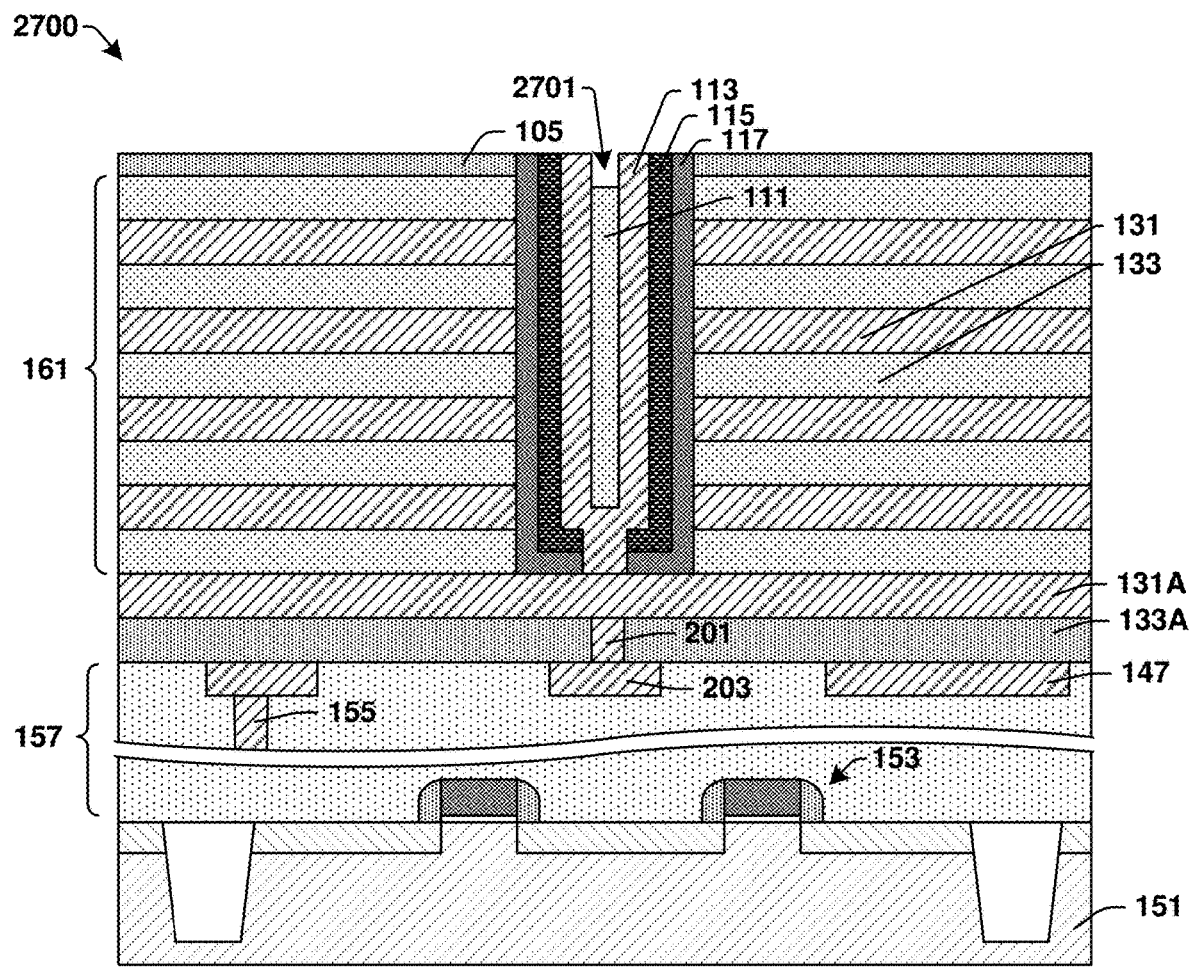
FIG. 27 illustrates a cross-sectional view for a variation of the process of FIGS. 12 to 26.

FIG. 27 provides a cross-sectional view 2700 that illustrates a variation of the process illustrated by the cross-sectional views 1200-2600 of FIGS. 12 through 26. The variation follows the formation of the dielectric 111 as shown in the cross-sectional view 2200 of FIG. 22. According to this variation, an etch is carried out to recess the dielectric 111 and form the opening 2701. The etch may be a dry etch or a wet etch. The opening 2701 is filled with conductive material to provide the conductive plug 401 as shown in FIG. 4.

Figure 28:
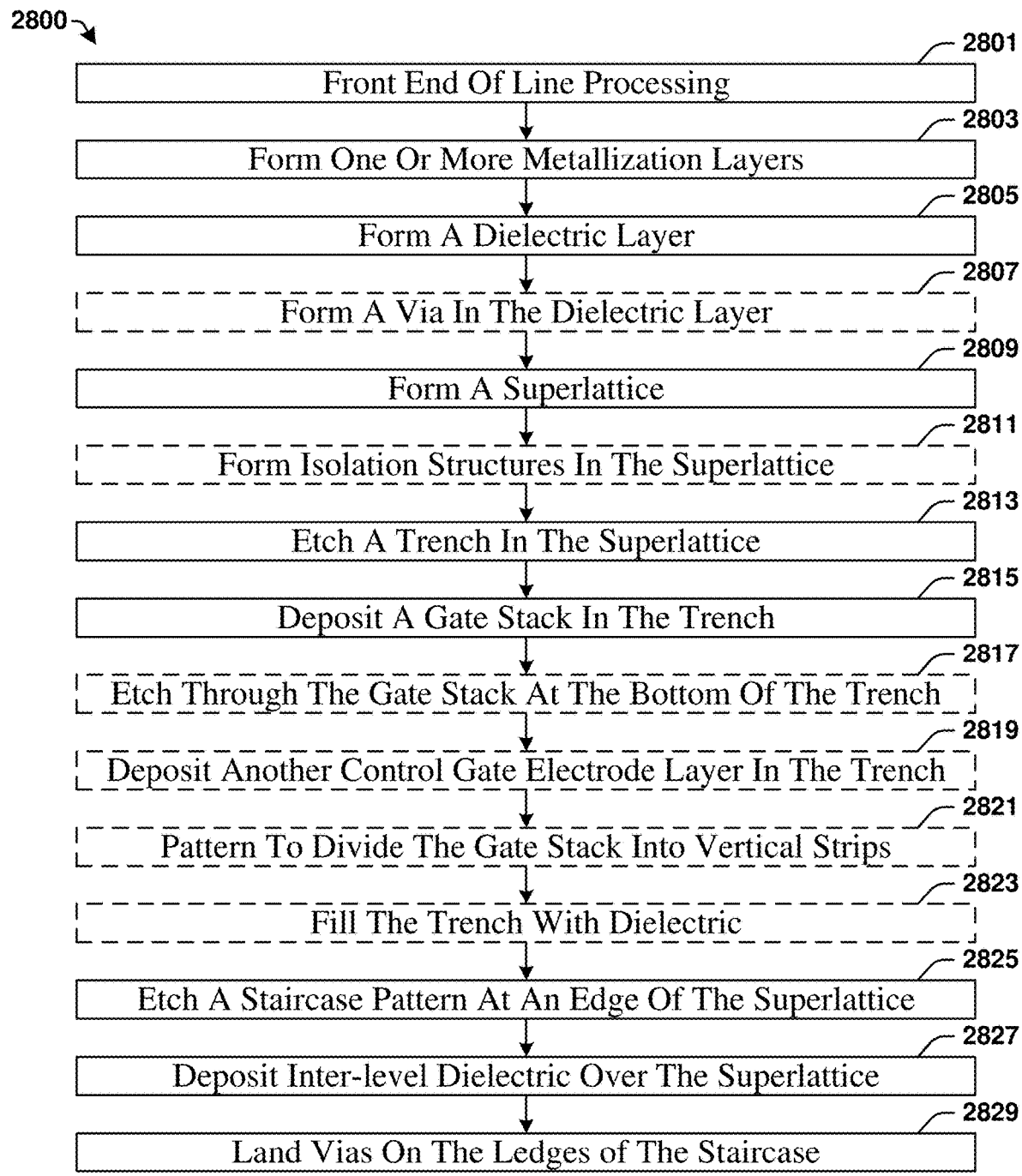
FIG. 28 is a flow chart for a process according to some embodiments of the present disclosure.

FIG. 28 presents a flow chart for a process 2800 that may be used to form an integrated chip according to the present disclosure. While the process 2800 of FIG. 28 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 2800 may begin with act 2801, front-end-of-line (FEOL) processing of a semiconductor substrate. This includes formation of diodes, transistors, and like semiconductor devices on or in a semiconductor substrate. Act 2803 is the initial stages of back-end-of-line (BEOL) processing and includes the formation of one or more metallization layers. Act 2805 is forming a dielectric layer on the uppermost of those metallization layers. The cross-sectional view 1200 of FIG. 12 provides an example of the structure at this stage of processing.

Act 2807 is an optional procedure of forming vias in the dielectric layer. These vias are formed when it is desired to couple the control gate structure to word lines through vias that are underneath the memory device as is done in the memory device 120B of FIG. 2. This act may be omitted, for example, when the gate electrodes are coupled to word lines through a horizontal conductive layer 131A as they are in the memory device 120A of FIG. 1 or through a top via as they are in the memory device 120C of FIG. 3. Forming the vias may comprise etching openings in the dielectric layer and filling the openings with conductive material. The cross-sectional views 1300 and 1400 of FIGS. 13 and 14 provide an example.

Act 2809 is forming a superlattice over the dielectric layer. The superlattice includes alternating layers of conductive material and dielectric material. The cross-sectional view 1500 of FIG. 15 provides an example.

Act 2811 is an optional step of forming isolation structures in the superlattice. Forming the isolation structures may comprises etching trenches in the superlattice and filling them with dielectric. The plan view 700 of FIG. 7 shows an example of these isolation structures.

Act 2813 is etching a trench in the superlattice. In some embodiments, the trench stops on the dielectric layer formed in act 2805. In some embodiments, the bottom of the trench stops on the horizontal conductive layer 131A. The cross-sectional view 1600 of FIG. 16 provides an example.

Act 2815 is forming a gate stack in the trench. The gate stack includes a semiconductor layer, a ferroelectric layer, and a control gate electrode layer. The cross-sectional view 1700 of FIG. 17 provides an example. In some embodiments the gate stack completely fills the trench to produce a structure as in the memory device 120E of FIG. 5.

Act 2817 is etching through the gate stack at the bottom of the trench to expose a word line contact and act 2819 is depositing another control gate electrode layer. These steps form a control gate structure that is coupled to the word line contact at the bottom of the trench. The cross-sectional views 1800 and 1900 of FIGS. 18 and 19 provide an example. The word line contact may be a bottom via or a horizontal conductive layer. These steps are optional. For example, these steps may not be used if the control gates structures are coupled to top vias as they are in the memory device 120C of FIG. 3.

Act 2821 is an optional step of patterning the gate stack to divide the gate stack on the sides of the trench into rows of side-by-side gate stacks. The division takes place along the length of the trench. The cross-sectional view 2000 of FIG. 20A and the plan view 2010 of FIG. 20B provide an example.

Act 2823 is filling the trench with dielectric. The cross-sectional view 2100 of FIG. 21 provides an example. This step may be eliminated if the trench has already been filled by the control gate structure. The control gate structure may fill the trench in either act 2815 or act 2819.

Act 2825 is forming a staircase at an edge of the superlattice. This may include a series of masking and etching processes. The cross-sectional view 2300 of FIG. 23 provides an example. Act 2827 is depositing an inter-level dielectric layer over the superlattice. The cross-sectional view 2400 of FIG. 24 provides an example.

Act 2829 is landing vias on the ledges of the staircase pattern. This may include etching holes in the inter-level dielectric layer and filling the holes with conductor. A metallization layer may simultaneously be formed over the superlattice in a dual damascene process. The cross-sectional views 2500 and 2600 of FIGS. 25 and 26 provide an example.

Some aspects of the present disclosure relate to an integrated chip that includes FeFETs. A first group of the FeFETs are in a first vertical column over the semiconductor substrate. The FeFETs comprise source/drain electrodes, a semiconductor channel, a gate electrode, and a ferroelectric layer between the gate electrode and the semiconductor channel. The source/drain electrodes are provided by horizontal conductive layers. The semiconductor channels for the FeFETs in the first group are provided by a continuous semiconductor layer. The gate electrodes for the FeFETs in the first group are connected in parallel. In some embodiments the ferroelectric layers for the FeFETs in the first group are provided by a continuous ferroelectric layer. In some embodiments, the continuous semiconductor layer is a first planar slab and the continuous ferroelectric layer is a second planar slab. In some embodiments, vias are directly over and coupled to the first horizontal conductive layers. In some embodiments, the gate electrodes are provided by a control gate structure having a wishbone-shaped profile.

In some embodiments, at least two FeFETs in the first group have their source/drain electrodes connected in parallel. In some embodiments, a source/drain electrode corresponding to a third FeFET in the first group is controllable independently from those of the two FeFETs. In some embodiments, the gate electrodes are coupled to a second horizontal conductive layer which juts out from underneath the other horizontal conductive layers. In some embodiments the gate electrodes are coupled to a via directly above the first vertical column. In some embodiments the gate electrodes are coupled to a via directly below the first vertical column. In some embodiments the horizontal conductive layers surround a control gate structure that provides the gate electrodes for the FeFETs in the first group.

In some embodiments, a second group of the FeFETs are in a second vertical column that is side-by-side with the first vertical column. The horizontal conductive layers that provide the source/drain electrodes for the FeFETs in the first group provide the source/drain electrodes for the FeFETs in the second group. In some embodiments, the gate electrodes of the FeFETs in the second group are coupled to the gate electrodes of the FeFETs in the first group. In some embodiments, the gate electrodes of the FeFETs in the second group are controllable independently from the gate electrodes of the FeFETs in the first group.

Some aspects of the present disclosure relate to an integrated chip comprising a stack of conductive layers separated by dielectric layers. An oxide semiconductor is in a vertical strip on a sidewall of the stack. A ferroelectric is in a vertical strip adjacent the oxide semiconductor. A gate structure is adjacent the ferroelectric. The stack, the oxide semiconductor, the ferroelectric, and the gate structure form ferroelectric field effect transistors for which the conductive layers provide sources and drains. In some embodiments, a row of vias connects with one of the conductive layers.

Some aspects of the present disclosure relate to a method that includes forming a superlattice of alternating conductive layers and dielectric layers, etching a trench in the superlattice, depositing a semiconductor layer in the trench, depositing a ferroelectric layer in the trench after the semiconductor layer, forming a control gate structure in the trench after the ferroelectric layer, and forming connections so that the control gate structure operates as a gate electrode, the conductive layers operate as source/drain regions, the ferroelectric layer provides a ferroelectric structure, and the semiconductor layer provides a channel for a ferroelectric field effect transistor. In some embodiments the method further includes etching to divide the semiconductor layer along a length of the trench. In some embodiments the control gate structure fills the trench. In some embodiments etching the trench stops on one of the conductive layers. In some embodiments, the method further includes an etch that forms an opening through the semiconductor layer and the ferroelectric layer at a bottom of the trench. A conductor is exposed through the opening. A conductive layer is deposited in the opening to form a control gate structure coupled to the conductor that is exposed through the opening. In some embodiments, the method further includes etching the superlattice so that the conductive layers that are lower in the superlattice jut out from underneath conductive layers that are higher in the superlattice. Vias are then made to land on the conductive layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a superlattice of alternating conductive layers and dielectric layers;
    etching a trench in the superlattice;
    depositing a semiconductor layer in the trench;
    depositing a ferroelectric layer in the trench after the semiconductor layer;
    forming a control gate structure in the trench after the ferroelectric layer; and
    forming connections so that the control gate structure operates as a gate electrode, the conductive layers operate as source/drain regions, the ferroelectric layer provides a data storage layer, and the semiconductor layer provides a channel for a ferroelectric field effect transistor.

2. The method of claim 1, further comprising etching to divide the semiconductor layer along a length of the trench.

3. The method of claim 1, wherein the control gate structure fills the trench.

4. The method of claim 1, wherein etching the trench stops on one of the conductive layers.

5. The method of claim 1, further comprising:
    etching to form an opening through the semiconductor layer and the ferroelectric layer at a bottom of the trench, wherein a conductor is exposed through the opening; and
    depositing conductive material to extend the control gate structure and bring it into contact with the conductor.

6. The method of claim 1, further comprising:
    etching the superlattice so that the conductive layers that are lower in the superlattice jut out from underneath conductive layers that are higher in the superlattice; and
    forming vias that land on the conductive layers.

7. A method of forming a memory device, the method comprising:
    forming a stack over a substrate, the stack comprising a plurality of horizontal conductive layers interleaved with dielectric layers;
    etching a trench in the stack, wherein the trench extends through the stack and stops on a bottommost one of the horizontal conductive layers;
    depositing a semiconductor layer and a ferroelectric layer in the trench, wherein the semiconductor layer and the ferroelectric layer conformally line sidewalls of the trench;
    etching an opening through the ferroelectric layer and the semiconductor layer at a bottom of the trench to expose the bottommost horizontal conductive layer; and
    depositing a first vertical conductive layer in the trench, wherein the first vertical conductive layer lines the sidewalls of the trench and fills the opening to contact the bottommost horizontal conductive layer.

8. The method of claim 7, further comprising, prior to etching an opening through the ferroelectric layer and the semiconductor layer at a bottom of the trench to expose the bottommost horizontal conductive layer, depositing a second vertical conductive layer in the trench, wherein the second vertical conductive layer deposits over the semiconductor layer and the first vertical layer deposits over the second vertical conductive layer.

9. The method of claim 8, wherein the second vertical conductive layer is present over the stack and is operative as a mask while etching the opening through the ferroelectric layer and the semiconductor layer at the bottom of the trench to expose the bottommost horizontal conductive layer.

10. The method of claim 8, further comprising prior to forming the stack, depositing a dielectric layer over the substrate and forming a wire or a via within the dielectric layer, wherein the bottommost horizontal conductive layer is disposed over and is electrically coupled to the wire or via.

11. The method of claim 10, further comprising depositing additional conductive material over the stack, wherein the additional conductive material forms an electrical connection with the second vertical conductive layer over the stack.

12. The method of claim 11, further comprising:
    after depositing the second vertical conductive layer, filling the trench with dielectric material; and
    prior to depositing the additional conductive material, etching to recess the dielectric material to create a recess, wherein the additional conductive material deposits within the recess.

13. The method of claim 10, wherein depositing the second vertical conductive layer fills the trench.

14. The method of claim 7, wherein the trench is one in a two-dimensional array of trenches etched into the stack.

15. The method of claim 7, wherein the method forms an array of ferroelectric field effect transistors for which the plurality of horizontal conductive layers provide source and drain regions.

16. The method of claim 7, wherein etching the trench divides the horizontal conductive layers, other than the bottommost conductive layer, in two.

17. The method of claim 7, wherein the trench is shorter than the stack, whereby the horizontal conductive layers penetrated by the trench remain unitary.

18. The method of claim 7, wherein the plurality of horizontal conductive layers are metal.

19. A method of forming a memory device, the method comprising:
    forming a metal feature over a semiconductor substrate;
    forming a stack over the metal feature, the stack comprising a plurality of horizontal conductive layers interleaved with dielectric layers;
    etching a trench in the stack, wherein the trench extends through the stack to the metal feature;
    depositing a semiconductor layer and a ferroelectric layer in the trench, wherein the semiconductor layer and the ferroelectric layer conformally line sidewalls of the trench;
    depositing a first metal layer over the stack and over the ferroelectric layer within the trench;
    etching an opening through the ferroelectric layer, the semiconductor layer, and the first metal layer at a bottom of the trench to expose the metal feature; and
    depositing a second metal layer, wherein the second metal layer forms an electrical connection between the metal feature and the first metal layer.

20. The method of claim 19, wherein the method forms an array of ferroelectric field effect transistors for which the plurality of horizontal conductive layers provide source and drain regions.

\* \* \* \* \*